US009536584B2

(12) United States Patent
Nebashi et al.

(10) Patent No.: US 9,536,584 B2
(45) Date of Patent: Jan. 3, 2017

(54) NONVOLATILE LOGIC GATE DEVICE

(71) Applicants: NEC CORPORATION, Minato-ku, Tokyo (JP); TOHOKU UNIVERSITY, Sendai-shi, Miyagi (JP)

(72) Inventors: Ryusuke Nebashi, Tokyo (JP); Noboru Sakimura, Tokyo (JP); Yukihide Tsuji, Tokyo (JP); Ayuka Tada, Tokyo (JP); Tadahiko Sugibayashi, Tokyo (JP); Takahiro Hanyu, Miyagi (JP); Tetsuo Endoh, Miyagi (JP); Hideo Ohno, Miyagi (JP)

(73) Assignees: NEC CORPORATION, Tokyo (JP); TOHOKU UNIVERSITY, Miyagi (JP)

( * ) Notice: Subject to any disclaimer, the term of this patent is extended or adjusted under 35 U.S.C. 154(b) by 9 days.

(21) Appl. No.: 14/400,950

(22) PCT Filed: May 15, 2013

(86) PCT No.: PCT/JP2013/064138
§ 371 (c)(1),
(2) Date: Nov. 13, 2014

(87) PCT Pub. No.: WO2013/187193
PCT Pub. Date: Dec. 19, 2013

(65) Prior Publication Data
US 2015/0138877 A1    May 21, 2015

(30) Foreign Application Priority Data

Jun. 11, 2012  (JP) .................................. 2012-132412

(51) Int. Cl.
*G11C 11/00* (2006.01)
*G11C 11/16* (2006.01)
(Continued)

(52) U.S. Cl.
CPC .......... *G11C 11/1675* (2013.01); *G11C 11/161* (2013.01); *G11C 11/1673* (2013.01);
(Continued)

(58) Field of Classification Search
CPC ............. G11C 13/0002; G11C 11/1675; G11C 11/161; G11C 11/1673; G11C 13/003; G11C 13/004; G11C 13/0069; G11C 2013/0054; G11C 2213/75; G11C 2213/78; G11C 2213/79; H01L 43/08; H01L 45/04; H03K 3/356121; H03K 19/18
(Continued)

(56) References Cited

U.S. PATENT DOCUMENTS

2003/0123199 A1   7/2003  Honda et al.
2005/0174837 A1   8/2005  Hanyu et al.
(Continued)

FOREIGN PATENT DOCUMENTS

JP   2005-235307 A   9/2005
JP      3812498 B2   8/2006

OTHER PUBLICATIONS

Translation of Relevant Part of Written Opinion of Japanese Patent Application of the ISA.
(Continued)

*Primary Examiner* — Fernando Hidalgo
(74) *Attorney, Agent, or Firm* — Sughrue Mion, PLLC

(57) ABSTRACT

A nonvolatile logic gate device is configured to include a resistive network of a memory structure in which at least three nonvolatile resistive elements are connected, a reference resistive network as a reference resistance providing a tolerance of the memory structure to a resistance value of the resistive network of the memory structure, a writing part operable to selectively write or rewrite a value of each of the
(Continued)

nonvolatile resistive elements in the resistive network into a maximum or a minimum corresponding to a logical value to be read when data are stored into the resistive network, and a logic circuit structure operable to use, as a logical value of the memory structure, a value obtained by comparison between the resistance value of the resistive network and the resistance value of the reference resistive network.

20 Claims, 19 Drawing Sheets

(51) Int. Cl.
    *H03K 19/18* (2006.01)
    *H03K 3/356* (2006.01)
    *G11C 13/00* (2006.01)

(52) U.S. Cl.
    CPC ........ *G11C 13/0002* (2013.01); *G11C 13/003* (2013.01); *G11C 13/004* (2013.01); *G11C 13/0069* (2013.01); *H03K 3/356121* (2013.01); *H03K 19/18* (2013.01); *G11C 2013/0054* (2013.01); *G11C 2213/75* (2013.01); *G11C 2213/78* (2013.01); *G11C 2213/79* (2013.01)

(58) Field of Classification Search
    USPC ....... 365/46, 55, 74, 97, 100, 131, 148, 158, 365/171, 173, 163
    See application file for complete search history.

(56) References Cited

U.S. PATENT DOCUMENTS

| | | | |
|---|---|---|---|
| 2012/0199895 A1* | 8/2012 | Nitta | G11C 11/14 257/295 |
| 2013/0258764 A1* | 10/2013 | Ranjan | G11C 11/16 365/158 |
| 2013/0293286 A1* | 11/2013 | Li | G11C 7/062 327/538 |
| 2016/0019943 A1* | 1/2016 | Chih | G11C 11/1673 365/158 |

OTHER PUBLICATIONS

International Search Report of PCT/JP2013/064138, dated Aug. 6, 2013. [PCT/ISA/210].

* cited by examiner (a)

(b)

| NO. | R1 | R2 | R3 | Rc(R1,R2,R3) | Rc(R1,R2,R3)−Rref | D | NUMBER OF INCORRECT RESISTIVE ELEMENTS (MINIMUM) |
|---|---|---|---|---|---|---|---|
| 1 | RL | RL | RL | 3·RL | −1.5·dR | 0 | 0 |
| 2 | RL | RL | RH | 2·RL+RH | −0.5·dR | 0 | 1 |
| 3 | RL | RH | RL | 2·RL+RH | −0.5·dR | 0 | 1 |
| 4 | RL | RH | RH | RL+2·RH | 0.5·dR | 1 | 1 |
| 5 | RH | RL | RL | 2·RL+RH | −0.5·dR | 0 | 1 |
| 6 | RH | RL | RH | RL+2·RH | 0.5·dR | 1 | 1 |
| 7 | RH | RH | RL | RL+2·RH | 0.5·dR | 1 | 1 |
| 8 | RH | RH | RH | 3·RH | 1.5·dR | 1 | 0 |

FIG. 6

NONVOLATILE LOGIC GATE DEVICE

CROSS REFERENCE TO RELATED APPLICATIONS

This application is a National Stage of International Application No. PCT/JP2013/064138 filed May 15, 2013, claiming priority based on Japanese Patent Application No. 2012-132412, filed Jun. 11, 2012, the contents of all of which are incorporated herein by reference in their entirety.

TECHNICAL FIELD

The present invention relates to a nonvolatile logic gate device which has a nonvolatile data memory structure by the use of resistance random access elements, and more particularly to a nonvolatile logic gate device which has an error tolerance against data writing and an integrated circuit which has such a nonvolatile logic gate device.

BACKGROUND ART

In recent years, an increase of electric power consumption caused by leakage currents of transistors has been problematic as a degree of integration of semiconductors increases. An arrangement in which a memory element and a logic element have been separated from each other results in data transfer delay and increased electric power consumption of wires for data transfer, both of which have also been problematic.

As one of methods for solving those problems, Patent Literature 1 has proposed an integrated circuit using a nonvolatile logic gate in which a memory element and a logic element have been integrated with each other. This integrated circuit is characterized in that data are not eliminated even if a power source is turned off because data are stored by a plurality of nonvolatile resistive elements. Therefore, the integrated circuit can dispense with a power source for holding data during an inoperative period. Accordingly, electric power consumption by a leakage current during an inoperative period can be reduced. Additionally, since the memory element and the logic element are arranged close to each other, the integrated circuit is expected to be operated with less wiring delay and less electric power consumption.

FIG. 1 shows an example of an arrangement of a nonvolatile logic gate that can be used for the aforementioned integrated circuit. The illustrated nonvolatile logic gate includes an NMOS logic circuit, nonvolatile resistive elements R1 and R2 and a through current control circuit for storing complementary data as resistance values, a sense circuit, and a writing part used for writing or rewriting data of the nonvolatile resistive elements. Furthermore, the sense circuit includes PMOS transistors P1 and P2 for latching output data and two PMOS transistors P3 and P4 for precharge. The sense circuit is connected to the NMOS logic circuit. Each of the illustrated nonvolatile resistive elements R1 and R2 has a first end connected to the NMOS logic circuit and a second end connected to the through current control circuit.

Next, specific connections of the components of the nonvolatile logic gate shown in FIG. 1 will be described. A gate of the PMOS transistor P1 is connected to a drain of the PMOS transistor P2, a drain of the PMOS transistor P4, and the NMOS logic circuit, and is also connected to a data output terminal for outputting an output signal /Dout. Meanwhile, a gate of the PMOS transistor P2 is connected to a drain of the PMOS transistor P1, a drain of the PMOS transistor P3, and the NMOS logic circuit, and is also connected to a data output terminal for outputting an output signal Dout. Gates of the PMOS transistors P3 and P4 are supplied with a clock signal CLK. Each of sources of the PMOS transistors P1, P2, P3, and P4 is connected to a power source voltage Vdd.

For example, a magnetic tunnel junction (MTJ) element using magnetoresistance effects may be used for the nonvolatile resistive elements R1 and R2 shown in FIG. 1. Here, an MTJ element has a ferromagnetic layer (free layer) variable in a direction of magnetization, a ferromagnetic layer (fixed layer) fixed in a direction of magnetization, and an insulator layer formed between the free layer and the fixed layer. When a current is supplied in a direction perpendicular to the film surface of such an MTJ element, the resistance value of the MTJ element varies depending upon the magnetization directions of the free layer and the fixed layer. The resistance value of the MTJ element decreases when the magnetization of the free layer and the magnetization of the fixed layer are parallel to each other, whereas the resistance value of the MTJ element increases when the magnetization of the free layer and the magnetization of the fixed layer are opposite to each other.

The MTJ element uses those characteristics to store data corresponding to the magnitude of the resistance value, i.e., the direction of the free layer. For example, a low-resistance state is made to correspond to data "0" while a high-resistance state is made to correspond to data "1". The nonvolatile logic gate uses data of this MTJ element for a logical operation.

Methods of writing data into an MTJ element include a magnetic field writing method of controlling a magnetization direction of a free layer by the use of a current magnetic field and a spin torque writing method of controlling a magnetization direction of a free layer by the use of a spin torque effect.

The nonvolatile logic gate shown in FIG. 1 performs a logical operation by the use of data stored in the nonvolatile resistive elements R1 and R2. Specifically, the nonvolatile logic gate performs a calculation between data stored in the nonvolatile resistive elements R1 and R2 and an input data Din externally inputted into the NMOS logic circuit, and outputs complementary outputs Dout and /Dout. A designer can determine what operation is performed by the nonvolatile logic gate, and can properly design the NMOS logic circuit for that purpose.

Now a configuration of the through current control circuit connected to the nonvolatile resistive elements R1 and R2 will be described with reference to FIGS. 2(a) and 2(b). The through current control circuit shown in FIG. 2(a) has an NMOS transistor N1. A drain of the NMOS transistor N1 is connected to an end of each of the nonvolatile resistive elements R1 and R2. A source of the NMOS transistor N1 is grounded, and a gate of the NMOS transistor N1 is supplied with a clock signal CLK.

Meanwhile, the through current control circuit shown in FIG. 2(b) has two NMOS transistors N1 and N2 and a capacitor C1 having a first end being grounded and a second end connected to a common junction of the NMOS transistors N1 and N2. Furthermore, a drain of the NMOS transistor N1 is connected to an end of each of the nonvolatile resistive elements R1 and R2, and a source of the NMOS transistor N1 is connected to a drain of the NMOS transistor N2 and the end of the capacitor C1. A gate of the NMOS transistor N1 is supplied with a clock signal CLK. A source of the NMOS transistor N2 is grounded, and a gate of the NMOS transistor N2 is supplied with an inversed clock signal /CLK.

The through current control circuits shown in FIGS. 2(a) and 2(b) differ from each other in existence or in non-existence of a through current flowing during a logical operation. In the case of the through current control circuit shown in FIG. 2(a), a current steadily flows through the nonvolatile resistive elements R1 and R2 and the NMOS transistor N1 when the clock signal CLK is at a high level. On the other hand, in the case of the through current control circuit shown in FIG. 2(b), a current flows through the nonvolatile resistive elements R1 and R2 and the NMOS transistor N1 only during the charging of the capacitor C1 when the clock signal CLK is at a high level. Therefore, less steady current flows in the circuit shown in FIG. 2(b) than in the circuit shown in FIG. 2(a). Accordingly, the through current control circuit shown in FIG. 2(b) can reduce electric power consumption during an operation.

FIG. 2(c) shows an example of an NMOS logic circuit forming a nonvolatile logic gate. This exemplary circuit illustrates an NMOS logic circuit (SUM circuit) for performing an addition or a sum operation. The illustrated NMOS logic circuit has eight NMOS transistors N3, N4, N5, N6, N7, N8, N9, and N10. Complementary input signals A and /A and C and /C are inputted as data input signals Din into gates of the NMOS transistors N3 to N10. A current path is formed in each of the NMOS logic circuits depending upon the corresponding input signal. An end of the nonvolatile resistive element R1 in the illustrated circuit configuration is electrically connected to the NMOS logic circuit on a side of outputting a data output Dout. An end of the nonvolatile resistive element R2 is electrically connected to the NMOS logic circuit on a side of outputting a data output /Dout. A difference of current values flowing through those two current paths is used to determine output voltages as data outputs Dout and /Dout, i.e., logical operation results (output results).

A nonvolatile logic gate formed by a combination of the components illustrated in FIGS. 1, 2(b), and 2(c) operates in the following manner. The illustrated nonvolatile logic gate has a precharge period and an evaluation period. Such an operation of the nonvolatile logic gate is a particular operation that differs from an operation of a general static CMOS circuit.

First, there is defined a precharge period during which a clock signal CLK is at a low level. During the precharge period, the NMOS transistor N1 of the through current control circuit (FIG. 2(b)) is turned off, and the PMOS transistors P3 and P4 of the sense circuit (FIG. 1) precharge the outputs Dout and /Dout into a power source voltage Vdd. Furthermore, at that timing, the NMOS transistor N2 (FIG. 2(b)) of the through current control circuit discharges charges accumulated in the capacitor C1.

Meanwhile, there is defined an evaluation period during which the clock signal CLK is at a high level. During the evaluation period, the NMOS transistor N1 of the through current control circuit (FIG. 2(b)) is turned on, the NMOS transistor N2 is turned off, and the precharge PMOS transistors P3 and P4 of the sense circuit (FIG. 1) is turned off.

The charges accumulated in capacitors (not shown) during the precharge flow into the capacitor C1 of the through current control circuit via the two current paths formed within the NMOS logic circuit and the nonvolatile resistive elements R1 and R2, which have stored the complementary resistance values. The currents flow through the nonvolatile resistive elements R1 and R2 depend upon the resistance values of the nonvolatile resistive elements R1 and R2. Therefore, a potential difference is produced between Dout and /Dout, which are complementary outputs. The potential difference is amplified by the PMOS transistors P1 and P2, and then complementary data output Dout and /Dout are outputted. It should be noted that, in this nonvolatile logic gate, the input signals A, /A, C, and /C should be unchanged during the evaluation period, during which the clock signal CLK is at a high level. In this manner, the nonvolatile logic gate has an operation function and a latch function.

PRIOR ART LITERATURE

Patent Literature

Patent Literature 1: JP-A-2005-235307

SUMMARY OF THE INVENTION

Problem(s) to be Solved by Invention

A nonvolatile logic gate in which a memory element and a logic element are integrated with each other as exemplified with reference to FIGS. 1, 2(a), 2(b), and 2(c) has some problems to be solved.

First, an error detection or an error correction of memory data stored in such a nonvolatile logic gate cannot readily be performed as it is. Thus, it is difficult to enhance or improve an error tolerance of the logic gate.

Examples of errors in memory data include a writing soft error caused to occur with a very low probability such that data different than intended are written and a soft error caused such that stored data are inversed for some reasons. A memory as a component of a general integrated circuit uses an error detection circuit during a reading operation to detect such a soft error.

Meanwhile, Patent Literature 1 discloses a nonvolatile logic gate in which a memory element and a logic element are integrated with each other. Such nonvolatile logic gates are disadvantageous in that an error detection circuit should be provided in each of the nonvolatile logic gates and results in an increase of an overhead of a circuit area.

An object of the present invention is to provide a nonvolatile logic gate using resistance random access elements that have an enhanced error tolerance so that a logical operation can correctly be performed even if an error is caused to occur in memory data.

The present invention also provides a nonvolatile logic gate device using resistance random access elements that have an improved error tolerance so that a logical operation can correctly be performed even if an error is caused to occur in memory data, and an integrated circuit including such a nonvolatile logic gate.

Means for Solving Problem(s)

A nonvolatile logic gate device according to the present invention is characterized by comprising a resistive network of a memory structure in which at least three nonvolatile resistive elements are connected, a reference resistive network which has a reference resistance providing a tolerance to a resistance value of the resistive network of the memory structure, a writing part configured to selectively write a maximum value or a minimum value as a value of each of the nonvolatile resistive elements, the maximum or the minimum value corresponding to a logical value to be read when data are stored into the resistive network, and a logic circuit structure configured to use, as a logical value of the memory structure, a value obtained by comparison between the resistance value of the resistive network and the resistance value of the reference resistive network.

An integrated circuit according to the present invention is characterized by comprising a logical operation circuit including the aforementioned nonvolatile logic gate device.

A method of enhancing an error tolerance of a nonvolatile logic gate device according to the present invention is characterized by providing a resistive network of a memory structure in which at least three nonvolatile resistive elements are connected, a reference resistive network having a reference resistance providing a tolerance of the memory structure to a resistance value of the resistive network, a writing part operable to change resistance values of the nonvolatile resistive elements, and a logic circuit structure operable to use, as a logical value of the memory structure, a value obtained by comparison between the resistance value of the resistive network and the resistance value of the reference resistive network, changing the reference resistance value of the reference resistive network so as to make the reference resistance value correspond to the resistance value of the resistive network, rewriting a value of each of the nonvolatile resistive elements in the resistive network into a maximum or a minimum corresponding to a logical value to be read when data are stored into the resistive network by the writing part, and providing a resistance to the logical value of the memory structure obtained by the logic circuit structure.

Advantageous Effect of the Invention

According to the present invention, there can be provided a nonvolatile logic gate using resistance random access elements that have an enhanced error tolerance while an increase of the circuit area and an increase of the electric power consumption are prevented, and an integrated circuit using such a nonvolatile logic gate.

BRIEF DESCRIPTION OF DRAWINGS

FIG. 6 is a table of resistance values of nonvolatile resistive elements and stored data of the nonvolatile logic gate that are represented by those resistance values, according to the first embodiment.

MODE(S) FOR CARRYING OUT THE INVENTION

Embodiments of the present invention will be described based upon the drawings.

Figure 3:
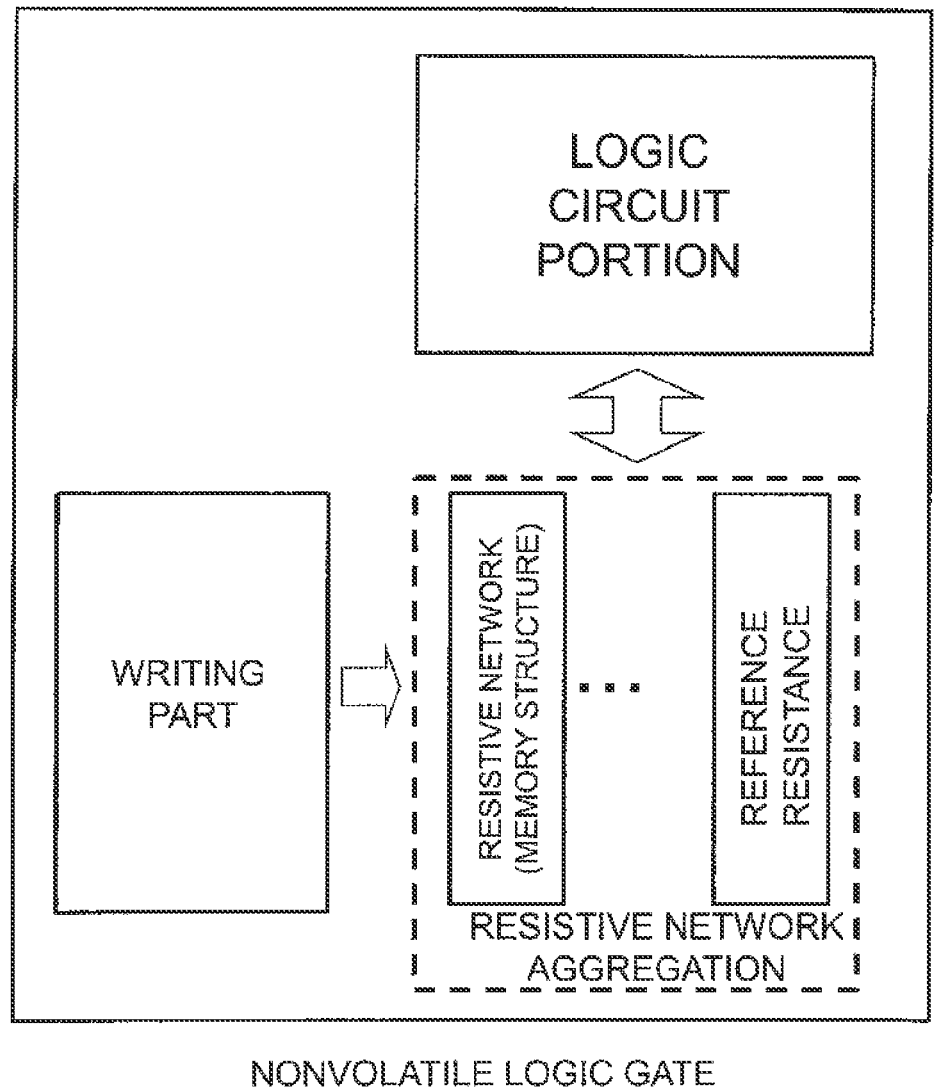
FIG. 3 is a circuit diagram of a resistive network aggregation according to a first embodiment of the present invention, and a nonvolatile logic gate having an enhanced tolerance with use of the resistive network aggregation.

FIG. 3 is a functional block diagram of a nonvolatile logic gate having an enhanced error tolerance, which will be described in the following embodiments, as compared to existing nonvolatile logic gates. Thus, the nonvolatile logic gate device uses, as memory structures, resistive networks formed of nonvolatile resistive elements. The nonvolatile logic gate device includes a reference resistive network for holding a value exhibiting tolerance of the memory structures, a writing part operable to rewrite values of the individual nonvolatile resistive elements, and a logic circuit part using logic values held by the memory structures. The nonvolatile logic gate device will be described in greater detail with reference to circuit diagrams.

First Embodiment

Figure 4:
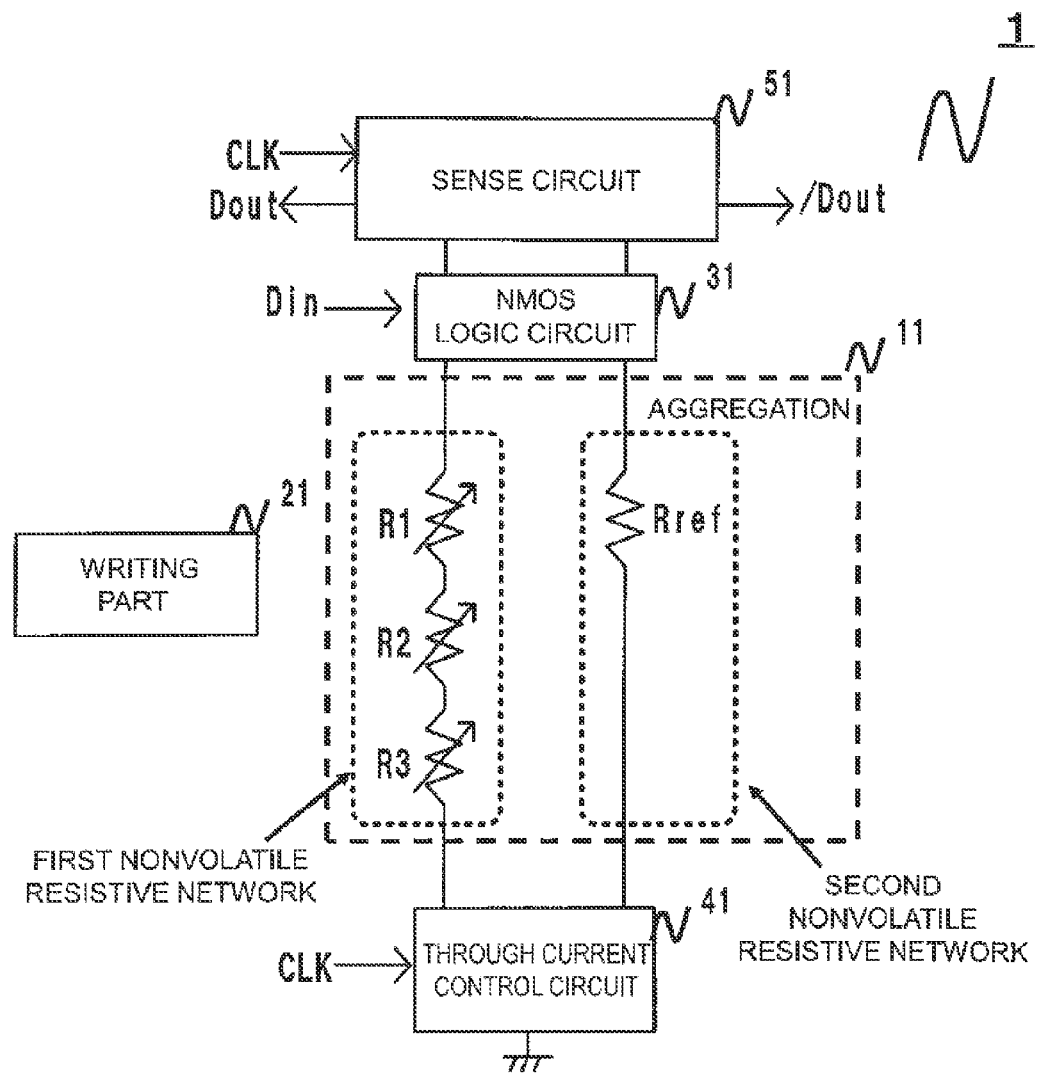
FIG. 4 is a circuit diagram of a resistive network aggregation according to the first embodiment and a nonvolatile logic gate using the resistive network aggregation.

FIG. 4 is a circuit diagram of a nonvolatile logic gate 1 having an enhanced error tolerance according to a first embodiment, as compared to existing nonvolatile logic gates.

As shown in FIG. 4, the nonvolatile logic gate 1 is part of an integrated circuit in which a memory element and a logic element are integrated with each other and includes a nonvolatile resistive network aggregation 11, a writing part 21, an NMOS logic circuit 31, a through current control circuit 41, and a sense circuit 51.

The NMOS logic circuit 31, the through current control circuit 41, and the sense circuit 51 of the present embodiment can employ the aforementioned circuit configuration described in Patent Literature 1.

The nonvolatile resistive network aggregation 11 includes a first nonvolatile resistive network having three nonvolatile resistive elements R1, R2, and R3 connected in series and a second nonvolatile resistive network having a value Rref, which is a reference resistance with respect to resistance values of those three nonvolatile resistive elements R1, R2, and R3. The resistance value Rref will be described below.

The nonvolatile resistive elements R1, R2, and R3 are connected in series. An end of the nonvolatile resistive elements is connected to the NMOS logic circuit, and the other end of the nonvolatile resistive elements is connected to the through current control circuit. A resistive network including three nonvolatile resistive elements thus connected is used as one memory structure. Furthermore, the second nonvolatile resistive network is configured to have a resistance value of Rref. An end of the second nonvolatile resistive network is connected to the NMOS logic circuit 31, and the other end of the second nonvolatile resistive network is connected to the through current control circuit 41.

Here, a combined resistance of R1, R2, and R3 is defined as Rc(R1, R2, R3). In this example, the combined resistance refers to a resistance between terminals when R1, R2, and R3 are connected in series. The nonvolatile logic gate 1 of the present embodiment compares the combined resistance Rc(R1, R2, R3) with Rref to perform a logical operation. Rref (second nonvolatile resistive network) may be implemented by a combined resistance of a combination of a plurality of nonvolatile resistive elements. Alternatively, Rref may be implemented by one or more transistors or other resistive elements such as one or more polysilicon resistors.

The writing part 21 has a function of writing or rewriting data of the nonvolatile resistive elements R1, R2, and R3 individually. Furthermore, the writing part 21 has a function of controlling the values of the nonvolatile resistive elements that provide Rref as needed.

Figure 2:
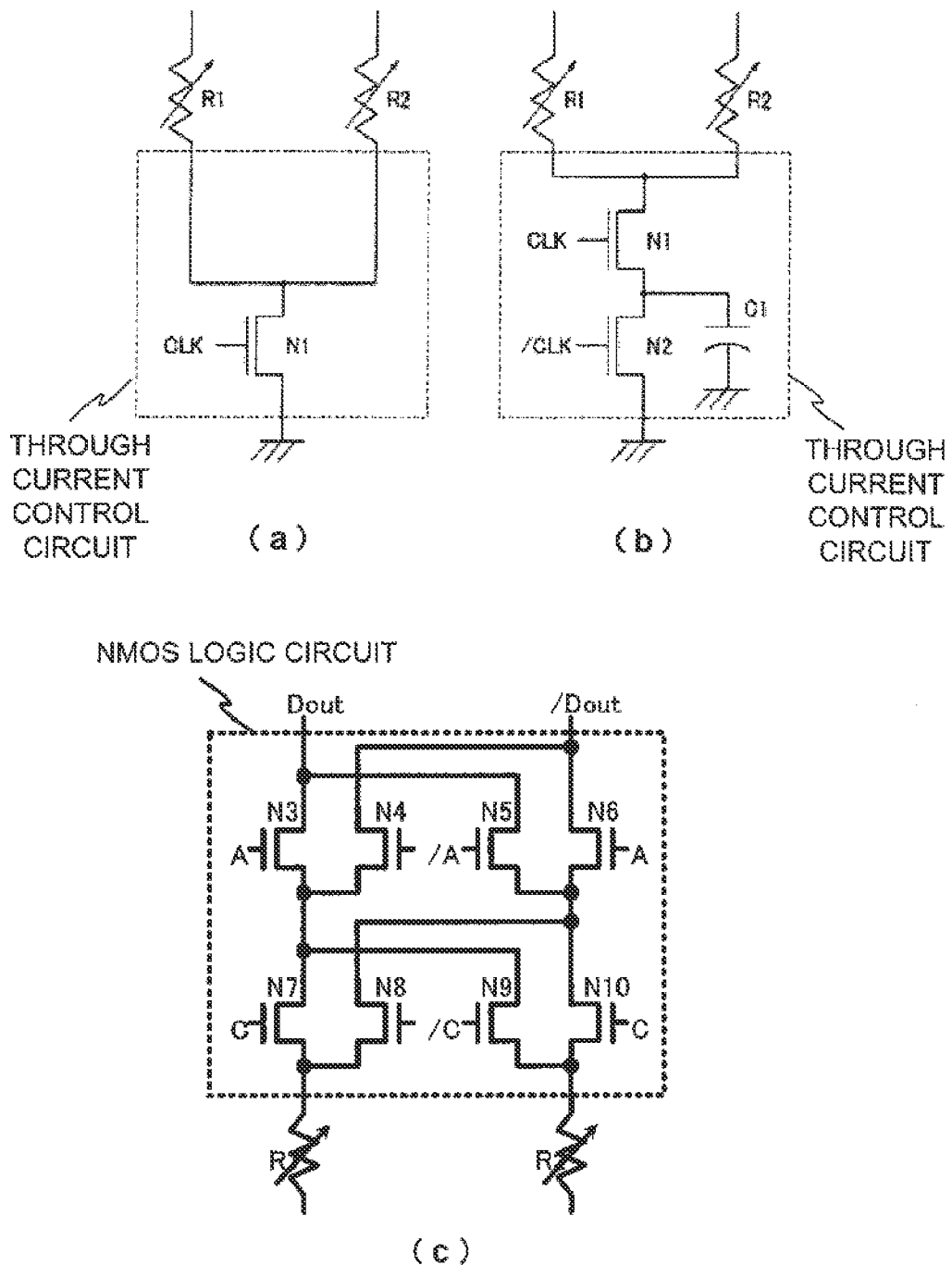
FIG. 2 includes diagrams explanatory of a circuit configuration described in Patent Literature 1. (a) shows a circuit in which a through current is generated when an operation is evaluated in the nonvolatile logic gate described in Patent Literature 1, (b) is a circuit diagram showing a circuit in which no through current is generated in the nonvolatile logic gate described in Patent Literature 1, and (c) is a diagram showing an NMOS logic circuit of the nonvolatile logic gate described in Patent Literature 1.

Each of the through current control circuit 41 and the NMOS logic circuit 31 can employ circuits shown in FIGS. 2(a) to 2(c).

Figure 1:
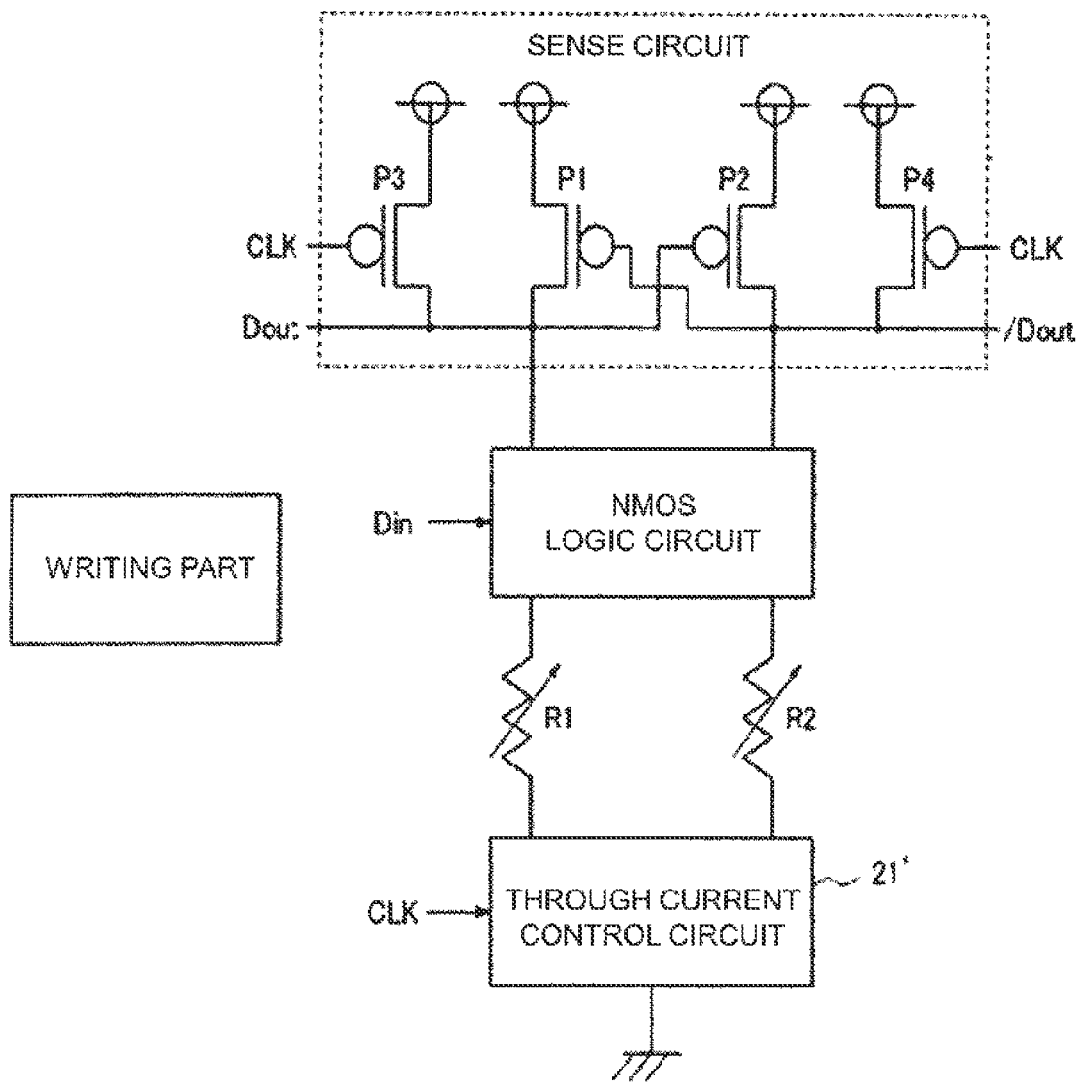
FIG. 1 is a diagram showing an example of an arrangement of a nonvolatile logic gate described in Patent Literature 1.
Figure 5:
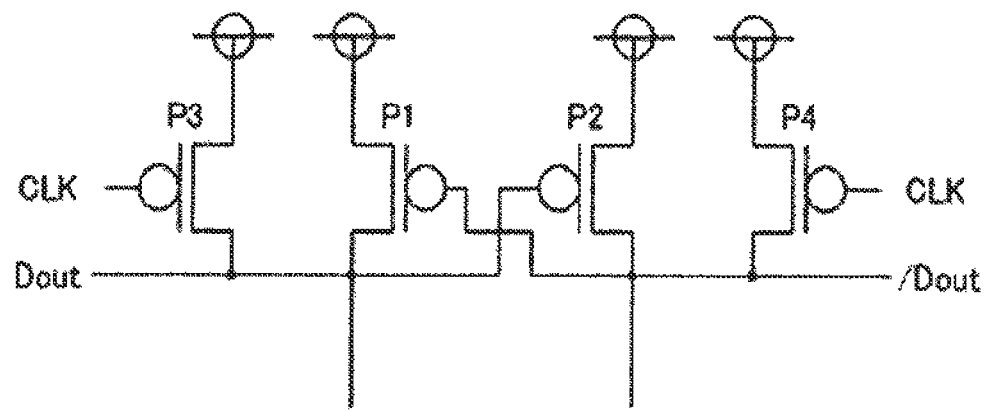
FIG. 5 shows circuit diagrams of a sense circuit in the nonvolatile logic gate having an enhanced error tolerance according to the first embodiment. (a) and (b) show different examples.
Figure 5:
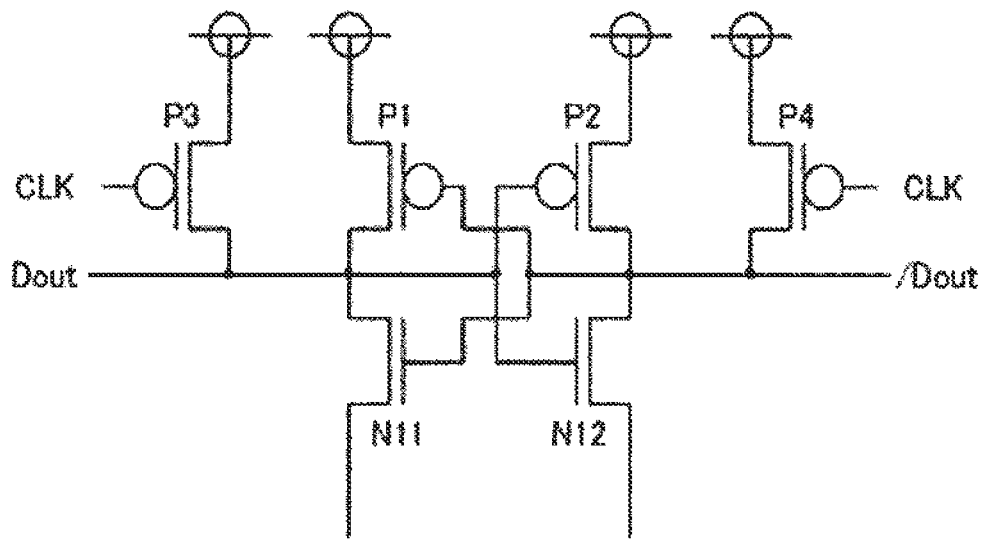

The sense circuit 51 is supplied with a clock signal. The sense circuit 51 has output terminals Dout and /Dout. Examples of the sense circuit 51 are shown in FIGS. 5(a) and 5(b). The sense circuit shown in FIG. 5(a) is the same as the sense circuit of the nonvolatile logic gate shown in FIG. 1. The sense circuit shown in FIG. 5(b) is configured by adding two NMOS transistors N11 and N12 to the configuration of FIG. 5(a) so as to form latches using the PMOS transistors P1 and P2 and the NMOS transistors N11 and N12.

Now an example using the SUM circuit illustrated in FIG. 2(c) as the NMOS logic circuit 31, the circuit illustrated in FIG. 2(a) as the through current control circuit 41, and the circuit illustrated in FIG. 5(a) as the sense circuit 51 will be described.

FIG. 6 shows the relationship between resistance values of the individual nonvolatile resistive elements and memory data used in the nonvolatile logic gate that are represented by those resistance values according to the first embodiment.

The first column in FIG. 6 represents the serial number. The second to fourth columns represent resistance values of the nonvolatile resistive elements R1, R2, and R3, respectively. The fifth column represents a combined resistance value Rc(R1, R2, R3). The sixth column represents a difference between the combined resistance value and the reference resistance value Rref. The seventh column represents memory data D of the nonvolatile logic gate, which are determined by the state of the nonvolatile resistive elements. The eighth column represents the minimum number of nonvolatile resistive elements that store incorrect data in the memory structure, which is estimated from a combination of the nonvolatile resistive elements R1, R2, and R3.

Now the symbols used in FIG. 6 will be described. For the resistance value of a nonvolatile resistive element, RL represents a resistance value in a low-resistance state, and RH represents a resistance value in a high-resistance state. A difference dR of those resistance values is defined by Formula 1.

$$RH-RL=dR \qquad \text{(Formula 1)}$$

Furthermore, Rref is between 3·RL and 3·RH. Rref is between N·RL and N·RH where N is the number of the nonvolatile resistive elements. A more preferable value can be defined by Formula 2.

$$Rref=3 \cdot RL+1.5 \cdot dR \qquad \text{(Formula 2-1)}$$

$$Rref=N \cdot RL+(N \cdot dR/2) \qquad \text{(Formula 2-2)}$$

Additionally, the number "0" in the seventh column represents data "0" used for a logical operation, and the number "1" represents data "1." In other words, the number in the seventh column represents a logical value to be read from the memory structure.

When the nonvolatile logic gate of this embodiment writes data, it controls the writing part 21 such that the nonvolatile resistive elements have resistance values of R1, R2, and R3 in the row of No. 1 if the data are "0" and that the nonvolatile resistive elements have resistance values of R1, R2, and R3 in the row of No. 8 if the data are "1."

The nonvolatile logic gate 1 of the present embodiment compares the combined resistance Rc(R1, R2, R3) with the reference resistance value Rref when a logical operation is to be performed by the NMOS logic circuit 31. If the difference (Rc(R1, R2, R3)−Rref) is negative (Nos. 1, 2, 3, and 5), the logical operation functions as data "0." If the difference is positive (Nos. 4, 6, 7, and 8), the logical operation functions as data "1." At that time, the writing part 21 operates as described above so that the memory structure exhibits an error tolerance.

As derived from the table shown in FIG. 6, the reliability can be maintained as follows. Referring to the second column to the fourth column and the seventh column of FIG. 6, even if the number of nonvolatile resistive elements storing an incorrect resistance value is zero or one, the data D can be used as a correct value for a logical operation by rewriting data of the nonvolatile resistive elements as shown at Nos. 1 and 8.

For example, it is assumed that a combination of the resistance values R1, R2, and R3 at No. 1 of FIG. 6 (all of R1, R2, and R3 are RL) is to be written with intention of writing data "0" and that a writing error occurs for some reasons so that the data of R3 become RH in error, rather than RL. The resistance state after the writing error is represented by the resistance values R1, R2, and R3 at No. 2. The difference between the combined resistance and the reference resistance value (see the sixth column) at that time becomes smaller (−0.5 dR) than that in the case of no error (−1.5 dR) but continues to be negative. Therefore, the data can be used correctly as data "0" for the logical operation.

Similarly, it can be seen that the nonvolatile logic gate 1 can operate correctly even if data RH, rather than RL, are incorrectly written into R1 (No. 5 of FIG. 6) or even if data RH, rather than RL, are incorrectly written into R2 (No. 3 of FIG. 6).

That is, the memory structure of the nonvolatile logic gate 1 according to the present embodiment can output data "0" correctly even if a data error occurs in one of R1, R2, and R3.

Next, a case of writing data "1" will be described. It is assumed that a combination of the resistance values R1, R2, and R3 at No. 8 of FIG. 6 (all of R1, R2, and R3 are RH) is to be written with intention of writing data "1" and that a writing error occurs for some reasons so that the data of R3 become RL in error, rather than RH. The resistance state after the soft error is represented by the resistance values R1, R2, and R3 at No. 7. The difference between the combined resistance and the reference resistance value (see the sixth column) at that time becomes smaller (0.5 dR) than that in the case of no error (1.5 dR) but continues to be positive. Therefore, the data can be used correctly as data "1" for the logical operation.

Similarly, it can be seen that the nonvolatile logic gate 1 can operate correctly even if data RL, rather than RH, are incorrectly written into R1 (No. 4 of FIG. 6) or even if data RL, rather than RH, are incorrectly written into R2 (No. 6 of FIG. 6).

That is, the memory structure of the nonvolatile logic gate 1 according to the present embodiment can output data "1" correctly even if a data error occurs in one of R1, R2, and R3.

If two or more data errors occur in this structure, the data are erroneously determined to cause malfunction. A specific example will be described with reference to FIG. 6. For example, it is assumed that a combination of the resistance values R1, R2, and R3 at No. 1 of FIG. 6 is to be written with intention of writing data "0" and that a writing error occurs for some reasons so that the data of R2 and R3 become RH in error, rather than RL. The resistance state after the writing error is represented by the resistance values R1, R2, and R3 at No. 4. The difference between the combined resistance and the reference resistance value at that time becomes positive. Therefore, the data are determined as data "1," which causes malfunction. However, the probability that two or more errors occur is considerably lower than the probability that no error occurs or one error occurs.

Next, description is made about the probability Pgate representing a probability that the nonvolatile logic gate of the present embodiment would malfunction. Here, a writing soft error is described as an example of soft errors. The probability that a writing soft error occurs in one nonvolatile resistive element is defined as P. The reference resistance is set correctly by Formula 2. Under those conditions, the probability Pgate that the nonvolatile logic gate of the present embodiment using three nonvolatile resistive elements malfunctions is given by the following Formula 3-1.

$$P\text{gate}=3 \cdot (P^2) \cdot (1-P) + P^3 \qquad \text{(Formula 3-1)}$$

When P is sufficiently lower than 1, Pgate is approximately in proportion to $3 \cdot P^2$.

Meanwhile, Pgate is in proportion to P in a case of a nonvolatile logic gate that stores 1-bit data with one nonvolatile resistive element and compares them with a reference resistance to perform a logical operation as in a circuit configuration described in Patent Literature 1.

Accordingly, it can be understood that the probability that the nonvolatile logic gate of the present embodiment malfunctions is sufficiently low.

As described above, the nonvolatile resistive network aggregation 11 according to the present embodiment and the nonvolatile logic gate 1 using the nonvolatile resistive network aggregation 11 can significantly reduce the probability of malfunction when an error occurs in data of the individual memory elements (nonvolatile resistive elements).

Furthermore, an error tolerance can be achieved by similar components (structures), preventing an increase of the circuit area of the nonvolatile logic gate and an increase of electric power consumption.

The first nonvolatile resistive network of the present embodiment is formed by three nonvolatile memory elements. Nevertheless, the number of the nonvolatile memory elements is not limited to three, and N nonvolatile resistive elements may be used where N is not less than three. Assuming that a determinable difference of the resistance values is 0.5·dR, the nonvolatile logic gate can operate correctly if the number of nonvolatile memory elements that store incorrect data is not more than (N−1)/2 where N is odd. The nonvolatile logic gate can operate correctly if the number of nonvolatile memory elements that store incorrect data is not more than (N−2)/2 where N is even.

Furthermore, the first nonvolatile resistive network of the present embodiment is more preferably formed of an odd number of nonvolatile memory elements than of an even number of nonvolatile memory elements. A tolerance number of errors is defined by the maximum number of nonvolatile memory elements storing incorrect data that meets such conditions that the nonvolatile logic gate of the present embodiment can operate correctly. Assuming that a determinable difference of the resistance values is 0.5·dR and that N is even, the tolerance number of errors is (N−2)/2 in a case where the first nonvolatile resistive network is formed of N nonvolatile memory elements and in a case where the nonvolatile resistive network is formed of N−1 nonvolatile memory elements. Therefore, the minimum number of nonvolatile memory elements that meets a certain tolerance number of errors is odd.

It is preferable to reduce the number of nonvolatile memory elements from the following two points of view.

First, reduction of the number of nonvolatile memory elements in the nonvolatile resistive network contributes to decreasing the probability Pgate that the nonvolatile logic gate malfunctions. For example, a comparison is now made between a case where the nonvolatile resistive network of this embodiment is formed of three nonvolatile resistive elements and a case where the nonvolatile resistive network is formed of four nonvolatile resistive elements. When the nonvolatile resistive network is formed of four nonvolatile resistive elements, the probability Pgate that the nonvolatile logic gate malfunctions is given by the following Formula 3-2.

$$P\text{gate}=6\cdot(P^2)\cdot((1-P)^2)+4\cdot(P^3)\cdot(1-P)+(P^4) \quad \text{(Formula 3-2)}$$

When P is sufficiently lower than 1, Pgate is approximately in proportion to $6\cdot P^2$. A comparison between Formula 3-1 and Formula 3-2 reveals that the probability that the nonvolatile logic gate malfunctions can be lowered to a larger degree in the case where the nonvolatile resistive network is formed of three nonvolatile resistive elements than in the case where the nonvolatile resistive network is formed of four nonvolatile resistive elements.

Second, reduction of the number of nonvolatile memory elements in the nonvolatile resistive network can prevent an increase of the circuit area of the nonvolatile logic gate.

In the nonvolatile resistive network of the present embodiment, the nonvolatile memory elements have been described as being connected to each other in series. As a connection method of the nonvolatile memory elements, a parallel connection or a series-parallel connection may be used instead of a series connection.

Second Embodiment

Figure 7:
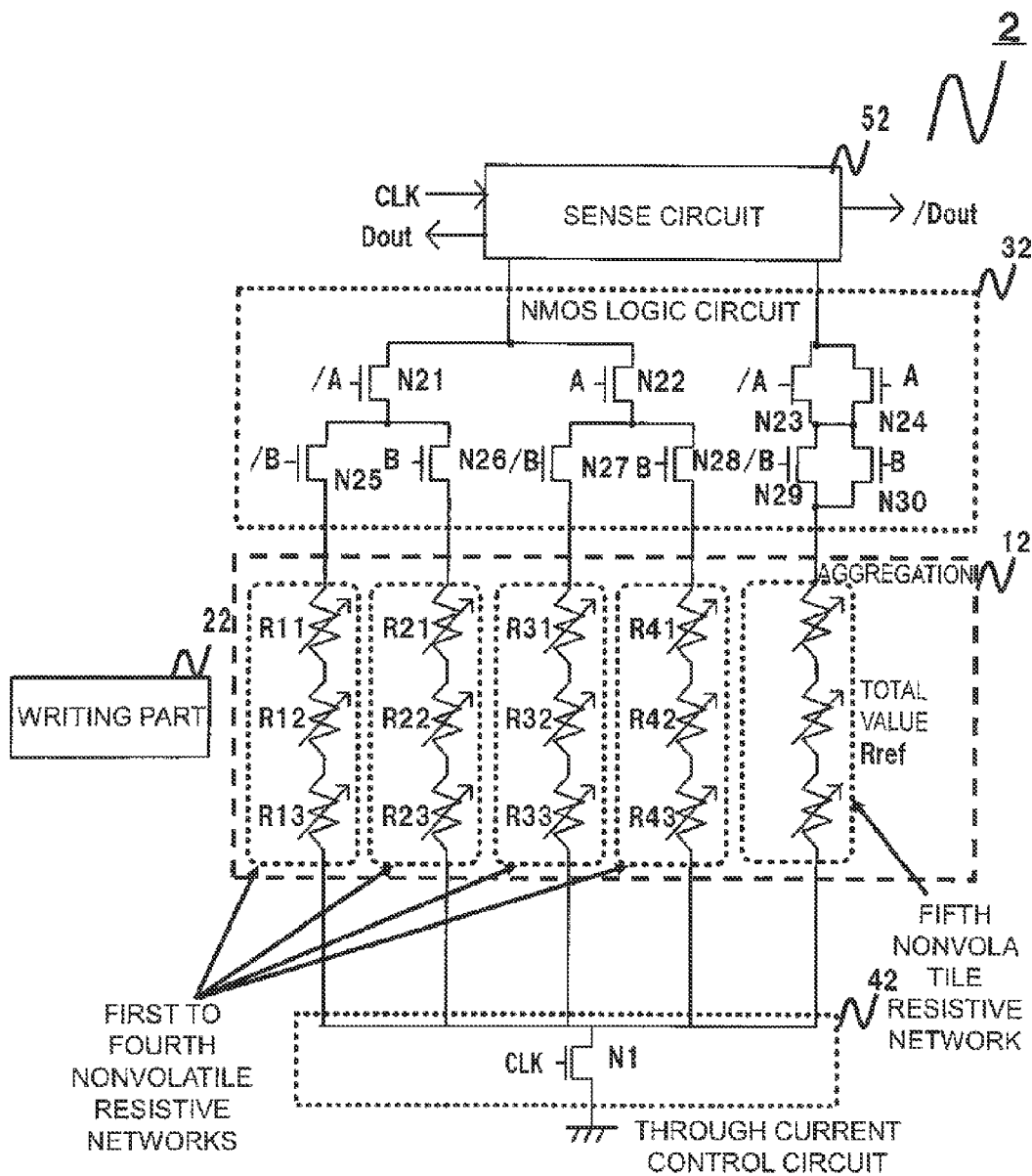
FIG. 7 is a circuit diagram of a resistive network aggregation according to a second embodiment of the present invention, and a nonvolatile logic gate using the resistive network aggregation.

FIG. 7 is a circuit diagram of a nonvolatile resistive network aggregation 12 according to a second embodiment and a nonvolatile logic gate 2 having an enhanced error tolerance with use of the nonvolatile resistive network aggregation 12.

In the present embodiment, the nonvolatile resistive network aggregation 12 includes a plurality of nonvolatile resistive networks. The nonvolatile logic gate 2 of the present embodiment serves as a 2-input lookup table. The nonvolatile resistive network aggregation 12 of the present embodiment is formed by a first nonvolatile resistive network, which includes three nonvolatile resistive elements R11, R12, and R13, a second nonvolatile resistive network, which includes three nonvolatile resistive elements R21, R22, and R23, a third nonvolatile resistive network, which includes three nonvolatile resistive elements R31, R32, and R33, and a fourth nonvolatile resistive network, which includes three nonvolatile resistive elements R41, R42, and R43. A fifth nonvolatile resistive network is configured to have a resistance value Rref. In other words, the fifth nonvolatile resistive network as a reference resistive network is configured in the same manner as other nonvolatile resistive networks.

When each of the nonvolatile resistive networks is identified by n, the nonvolatile resistive elements Rn1, Rn2, and Rn3 are connected in series. An end of the nonvolatile resistive elements Rn1, Rn2, and Rn3 is connected to the NMOS logic circuit, and the other end of the nonvolatile resistive elements Rn1, Rn2, and Rn3 is connected to the through current control circuit. In the present embodiment, the same nonvolatile resistive elements are used. In this case, a combined resistance of Rn1, Rn2, and Rn3 in all of the nonvolatile resistive networks used as memory structures can be defined as Rc(Rn1, Rn2, Rn3). Furthermore, the fifth nonvolatile resistive network is configured to have a resistance value Rref. An end of the fifth nonvolatile resistive network is connected to the NMOS logic circuit, and the other end of the fifth nonvolatile resistive network is connected to the through current control circuit. The nonvolatile logic gate 2 of the present embodiment compares the combined resistance Rc(Rn1, Rn2, Rn3) in each of network with Rref to perform a logical operation. As with the first embodiment, the reference resistance value Rref is defined by Formula 2.

The writing part 22 has a function of rewriting data of the nonvolatile resistive elements Rn1, Rn2, and Rn3. As with the writing part 21 of the first embodiment, the writing part 22 writes data with a resistance value RH in a high-resistance state or with a resistance value RL in a low-resistance state for all of three nonvolatile resistive elements Rn1, Rn2, and Rn3.

The NMOS logic circuit 32 is configured to serve as a 2-input lookup table. The illustrated NMOS logic circuit 32 includes 10 NMOS transistors N21, N22, N22, N23, N24, N25, N26, N27, N28, N29, and N30. Complementary input signals A and /A and B and /B are inputted as data input signals into gates of the NMOS transistors N21 to N30. In the NMOS logic circuit 32, current paths are formed depending upon respective input signals. One of input terminals of the sense circuit 52 is electrically connected to one of the first to fourth nonvolatile resistive networks, and the other input terminal of the sense circuit 52 is electrically connected to the fifth nonvolatile resistive network. A difference of currents flowing through those two current paths is used to determine an output voltage as a data output Dout and /Dout, i.e., logical operation results (output results). Accordingly, the NMOS logic circuit 32 serves as a 2-input lookup table if an output value in a truth table that is to be implemented as a 2-input lookup table is preset in the nonvolatile resistive elements selected by the inputs A and B.

The same circuit as described in the first embodiment can be used for the sense circuit 52. The through current control circuit 42 may use the same circuit as described in the first embodiment instead of the illustrated circuit.

Unlike the first embodiment, the nonvolatile logic gate 2 of the present embodiment includes a plurality of nonvolatile resistive networks. However, only one nonvolatile resistive network is needed for the (fifth) reference nonvolatile resistive network as with the first embodiment. Therefore, the circuit area is prevented from increasing. The reference nonvolatile resistive network may be provided for each of other nonvolatile resistive networks.

As described above, the nonvolatile resistive network aggregation 12 having a plurality of nonvolatile resistive networks according to the present embodiment and the nonvolatile logic gate 2 using the nonvolatile resistive network aggregation 12 can significantly reduce the probability of malfunction when an error occurs in data of the individual memory elements (nonvolatile resistive elements) while preventing the circuit area from increasing.

Third Embodiment

Figure 8:
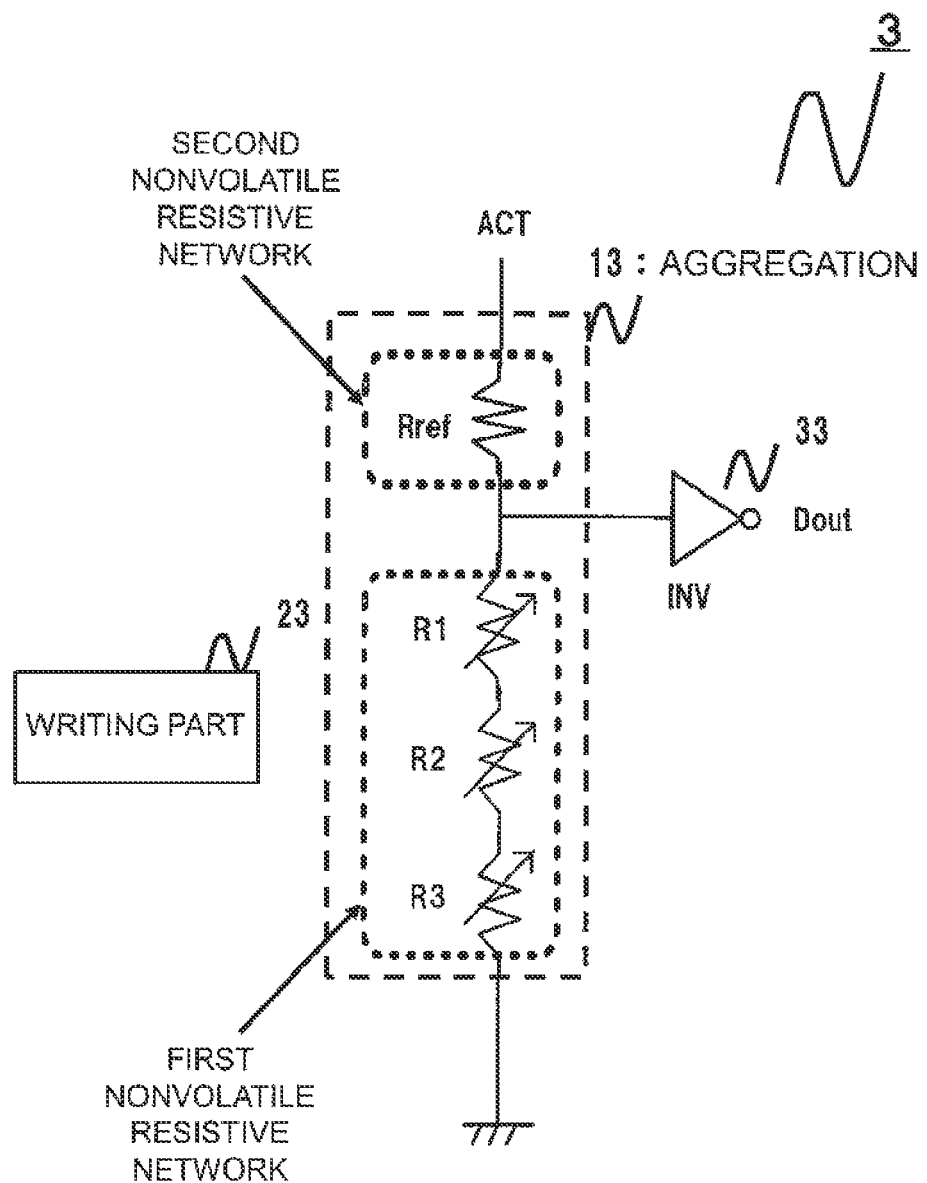
FIG. 8 is a circuit diagram of a resistive network aggregation according to a third embodiment of the present invention, and a nonvolatile logic gate using the resistive network aggregation.

FIG. 8 is a circuit diagram of a nonvolatile resistive network aggregation 13 according to a third embodiment and a nonvolatile logic gate 3 having an enhanced error tolerance with use of the nonvolatile resistive network aggregation 12. The nonvolatile resistive network aggregation 13 of the present embodiment includes a first nonvolatile resistive network, which includes three nonvolatile resistive elements R1, R2, and R3. A second nonvolatile resistive network is configured to have a resistance value Rref.

The nonvolatile resistive elements R1, R2, and R3 are connected to each other in series. An end of the nonvolatile resistive elements R1, R2, and R3 is connected to an input terminal of an inverter circuit, and the other end of the nonvolatile resistive elements R1, R2, and R3 is grounded to a Gnd voltage. The second nonvolatile resistive network is configured to have a resistance value Rref. An end of the second nonvolatile resistive network is connected to the input terminal of the inverter circuit 33, and the other end of the second nonvolatile resistive network is connected to an ACT signal. Here, a combined resistance of R1, R2, and R3 is defined as Rc(R1, R2, R3). In this example, the combined resistance refers to a resistance between terminals when R1, R2, and R3 are connected in series.

The first nonvolatile resistive network is managed by the writing part 33 such that all of R1, R2, and R3 have a resistance value RL in a low-resistance state during a writing operation of data "0." Furthermore, the first nonvolatile resistive network is managed such that all of R1, R2, and R3 have a resistance value RH in a high-resistance state during a writing operation of data "1." The nonvolatile logic gate 3 of the present embodiment compares the combined resistance Rc(R1, R2, R3) with Rref to read a value and perform a logical operation.

The inverter circuit 33 outputs data "0" if a voltage higher than a threshold voltage Vth is inputted, and outputs data "1" if a voltage higher lower a threshold voltage Vth is inputted. Therefore, the inverter circuit 33 serves not only as a logic circuit, but also as a sense circuit. When a Gnd voltage is provided as data "0" to the ACT terminal, the input voltage of the inverter circuit 33 is the Gnd voltage. The inverter circuit 33 outputs data "1" as the output Dout. On the other hand, when a power source voltage Vdd is provided as data "1" to the ACT terminal, the input voltage Vin of the inverter circuit 33 is given by the following Formula 4.

$$Vin=Rc(R1,R2,R3)/(Rc(R1,R2,R3)+Rref)\cdot Vdd \quad \text{(Formula 4)}$$

This value Vin is compared with the threshold Vth to determine the output Dout.

The following voltages are possible for Vin.

First, the input voltage to the inverter circuit 33 for data "0" is $(3\cdot RL)/(3\cdot RL+Rref)\cdot Vdd$.

Furthermore, the input voltage to the inverter circuit 33 for data "1" is $(3\cdot RH)/(3\cdot RH+Rref)\cdot Vdd$.

Moreover, when one nonvolatile resistive element has incorrect data, the input voltage for data "0" is $(2\cdot RL+RH)/((2\cdot RL+RH)+Rref)\cdot Vdd$.

Furthermore, when one nonvolatile resistive element has incorrect data, the input voltage for data "1" is $(RL+2\cdot RH)/((RL+2\cdot RH)+Rref)\cdot Vdd$.

Findings from those relationships reveal that a threshold Vth set by the following formula can ensure a correct operation even if an error occurs in data of one of the nonvolatile resistive elements.

$$(3\cdot RL)/(3\cdot RL+Rref)\cdot Vdd<(2\cdot RL+RH)/((2\cdot RL+RH)+Rref)\cdot Vdd<Vth<(RL+2\cdot RH)/((RL+2\cdot RH)+Rref)\cdot Vdd<(3\cdot RH)/(3\cdot RH+Rref)\cdot Vdd \quad \text{(Formula 5)}$$

The threshold Vth that meets the above Formula 5 can be designed as needed by changing the size of an NMOS transistor and a PMOS transistor in the inverter circuit 33.

Furthermore, the resistance value RL in a low-resistance state, the resistance value RH in a high-resistance state, and the reference resistance value Rref of the nonvolatile resistive element can be designed by the film thickness or the size of a tunnel film so as to meet the conditions of the above Formula 5.

The nonvolatile logic gate of the present embodiment uses the nonvolatile resistive networks connected in series so that one current path is formed in a reading operation. Therefore, the nonvolatile logic gate is expected to operate with reduced electric power consumption.

As described above, the nonvolatile resistive network aggregation 13 having nonvolatile resistive networks connected in series according to the present embodiment and the nonvolatile logic gate 3 using the nonvolatile resistive network aggregation 11 can significantly reduce the probability of malfunction when an error occurs in data of the individual memory elements (nonvolatile resistive elements).

Fourth Embodiment

Figure 9:
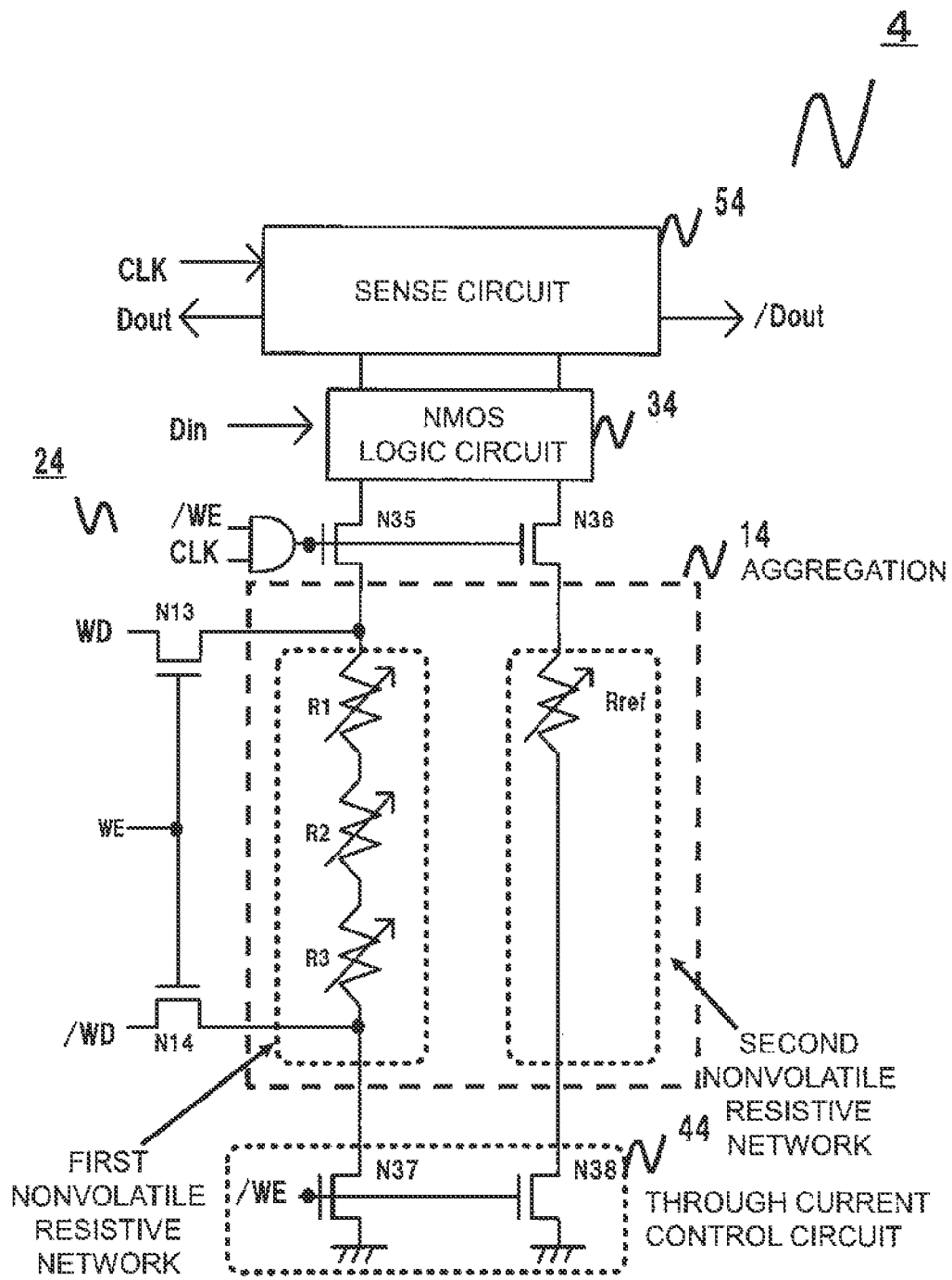
FIG. 9 is a circuit diagram of a resistive network aggregation according to a fourth embodiment of the present invention, and a nonvolatile logic gate using the resistive network aggregation.

FIG. 9 is a circuit diagram of a nonvolatile resistive network aggregation 14 according to a fourth embodiment and a nonvolatile logic gate 4 having an enhanced error tolerance with use of the nonvolatile resistive network aggregation 14. In the nonvolatile logic gate 4 of the present embodiment, a specific writing part 24 for nonvolatile resistive elements uses the spin torque effect of the nonvolatile resistive elements. Furthermore, the writing part 24 includes NMOS transistors N13, N14, N35, N36, N37, and N38, an AND gate, complementary data input signals WD and /WD, and writing enable signals WE and /WE.

Connections of the writing part 24 of the nonvolatile logic gate 4 of the present embodiment will be described. A first nonvolatile resistive network includes nonvolatile resistive elements R1, R2, and R3, which are connected in series. An end of the nonvolatile resistive elements R1, R2, and R3 is connected to the NMOS transistors N13 and N35, and the other end of the nonvolatile resistive elements R1, R2, and R3 is connected to the NMOS transistors N14 and N37. An end of a second nonvolatile resistive network having a resistance value Rref is connected to the NMOS transistor N36, and the other end of the second nonvolatile resistive network is connected to the NMOS transistor N38.

An end of the NMOS transistor N13 is connected to the writing data WD, and the other end of the NMOS transistor N13 is connected to the nonvolatile resistive element R1. A gate of the NMOS transistor N13 is connected to the writing enable signal WE. An end of the NMOS transistor N14 is connected to the writing data /WD, and the other end of the NMOS transistor N14 is connected to the nonvolatile resistive element R3. A gate of the NMOS transistor N14 is connected to the writing enable signal WE.

A drain of the NMOS transistor N35 is connected to the NMOS logic circuit 34, and a source of the NMOS transistor N35 is connected to the nonvolatile resistive element R1. A gate of the NMOS transistor N35 is connected to an output of the AND gate, which has inputs of the writing disable signal /WE and a clock CLK. A drain of the NMOS transistor N36 is connected to the NMOS logic circuit 34, and a source of the NMOS transistor N36 is connected to the second nonvolatile resistive network, which has a resistance value Rref. A gate of the NMOS transistor N36 is connected to the aforementioned output of the AND gate.

A drain of the NMOS transistor N37 is connected to the nonvolatile resistive element R3, and a source of the NMOS transistor N37 is grounded. A gate of the NMOS transistor N37 is connected to the writing disable signal /WE. A drain of the NMOS transistor N38 is connected to the second nonvolatile resistive network, which has a resistance value Rref, and a source of the NMOS transistor N38 is grounded. A gate of the NMOS transistor N38 is connected to the writing disable signal /WE.

The sense circuit 54 in the nonvolatile logic gate 4 of the present embodiment uses the circuit illustrated in FIG. 5(b). Furthermore, the NMOS logic circuit 34 uses the circuit illustrated in FIG. 2(c).

Figure 10:
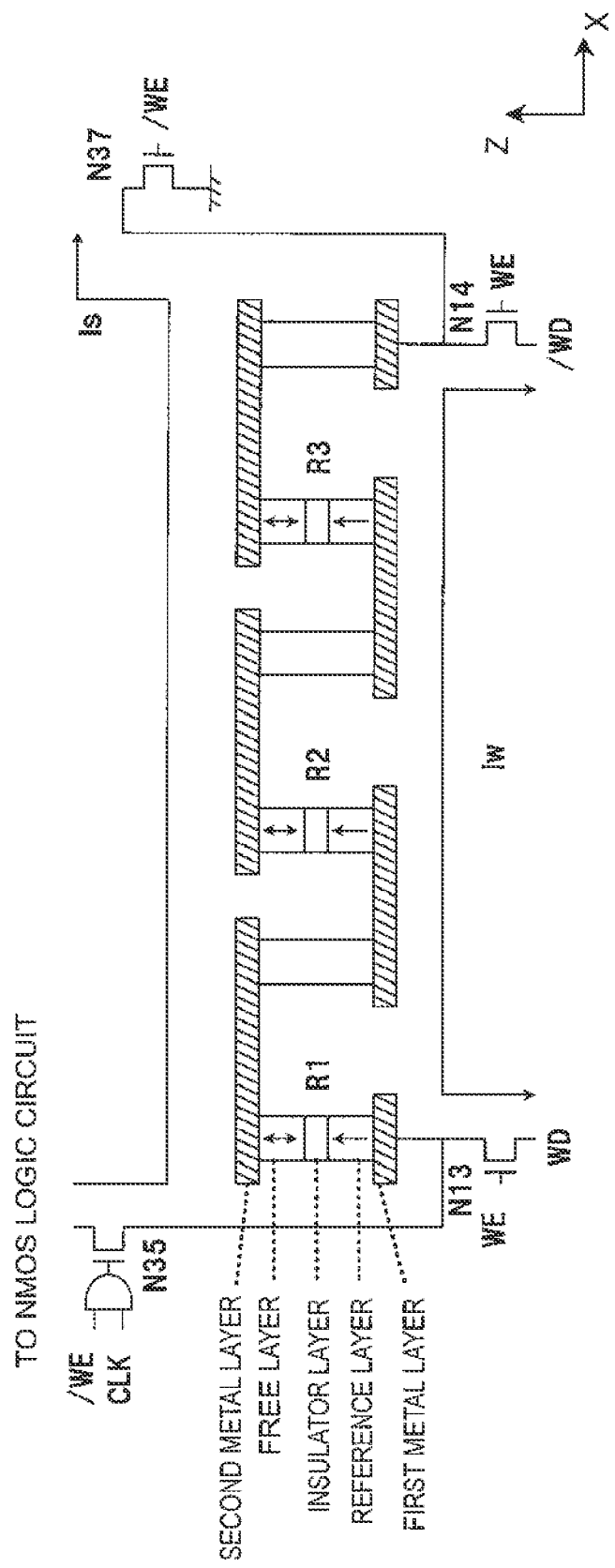
FIG. 10 is a cross-sectional view of the resistive network aggregation according to the fourth embodiment of the present invention, and the nonvolatile logic gate using the resistive network aggregation.
Figure 11:
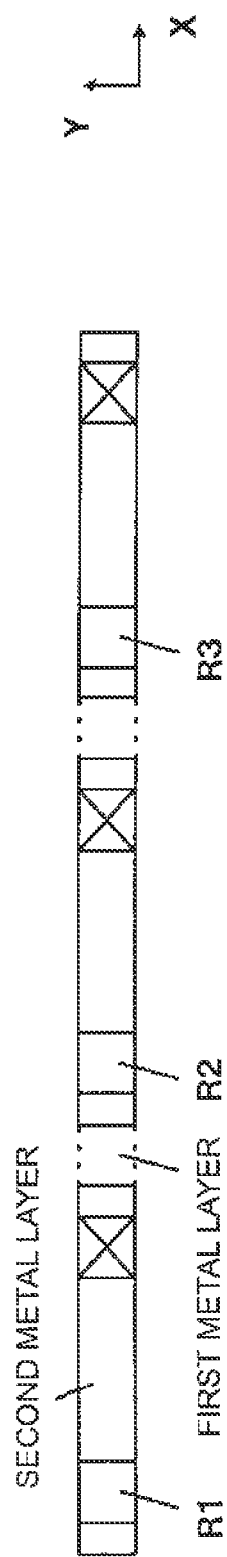
FIG. 11 is a top view of the resistive network aggregation according to the fourth embodiment of the present invention, and the nonvolatile logic gate using the resistive network aggregation.

FIG. 10 is a cross-sectional view showing the vicinity of the first nonvolatile resistive network in the present embodiment. FIG. 10 shows the AND gate, the NMOS transistors N13, N14, N35, and N37, the nonvolatile resistive elements R1, R2, and R3. FIG. 11 is a plan view showing the vicinity of the first nonvolatile resistive network in the present embodiment. FIG. 11 shows the nonvolatile resistive elements, first metal layers, and second metal layers.

Each of the nonvolatile resistive elements R1, R2, and R3 includes a free layer, an insulator layer, and a reference layer. As an example of the structure, a magnetic thin film having perpendicular magnetic anisotropy is used for the free layer and the reference layer. The free layer and the reference layer may comprise a magnetic thin film having in-plane magnetic anisotropy. As a specific material for the free layer and the reference layer, it is preferable to use a material including at least one selected from Fe, Co, and Ni. Furthermore, the film thickness of the free layer and the reference layer is preferably in a range of 1 nm to 20 nm.

A cross-sectional structure of the nonvolatile logic gate 4 of the present embodiment will be described with reference to FIG. 10. The cross-sectional structure includes, from the side of the substrate, transistor layers forming CMOS circuits, first metal layers, reference layers, insulator layers, free layers, and second metal layers, which form the nonvolatile resistive elements R1, R2, and R3. Each of the nonvolatile resistive elements R1, R2, and R3 may have a memory structure with a free layer, an insulator layer, and a reference layer stacked in the order from the side of the substrate. The writing with the writing part 24 employs the spin torque effect. The magnetization of the free layer can be directed to the Z-direction or −Z-direction by the direction in which the writing current Iw flows.

The writing current Iw in the nonvolatile logic gate of the present embodiment flows through the NMOS transistors N13 and N14 and through the nonvolatile resistive elements R1, R2, and R3 connected in series. The direction of the magnetization of the free layer can be directed to the Z-direction or −Z-direction according to the direction of the writing current Iw. The reading current Is flows through the sense circuit 54, the NMOS logic circuit 34, the NMOS transistor N35, the three nonvolatile resistive elements R1, R2, and R3, and the NMOS transistor N37 in turn to the ground.

Next, the two-dimensional structure of the first nonvolatile resistive network according to the present embodiment will be described with reference to FIG. 11. The nonvolatile resistive elements R1, R2, and R3 are electrically connected in series. The two-dimensional shapes of the nonvolatile resistive elements R1, R2, and R3 are illustrated as being square but are not limited to being square. The nonvolatile resistive elements R1, R2, and R3 may have other shapes. For example, in a case of a magnetic thin film having in-plane magnetic anisotropy, the two-dimensional shape of the nonvolatile resistive element may be designed so as to have an easy axis of magnetization along a longitudinal direction of a rectangle.

In the nonvolatile logic gate 4 of the present embodiment, the nonvolatile resistive network is formed by three nonvolatile resistive elements in order to enhance an error tolerance. A writing current is passed in series through those connected nonvolatile resistive elements. The nonvolatile resistive elements are subjected to a writing process concurrently by the same current. Therefore, no writing circuit is added, so that a circuit area to be added can be reduced. At the same time, the electric power consumption can also be reduced. Furthermore, the nonvolatile resistive elements are stacked on the CMOS circuits. Therefore, an increase of the circuit area can be prevented.

As described above, the nonvolatile resistive network aggregation 14 according to the present embodiment and the nonvolatile logic gate 4 using the nonvolatile resistive network aggregation 14 can enhance the error tolerance while an addition of the circuit area and an increase of the electric power consumption are prevented.

Fifth Embodiment

Figure 12:
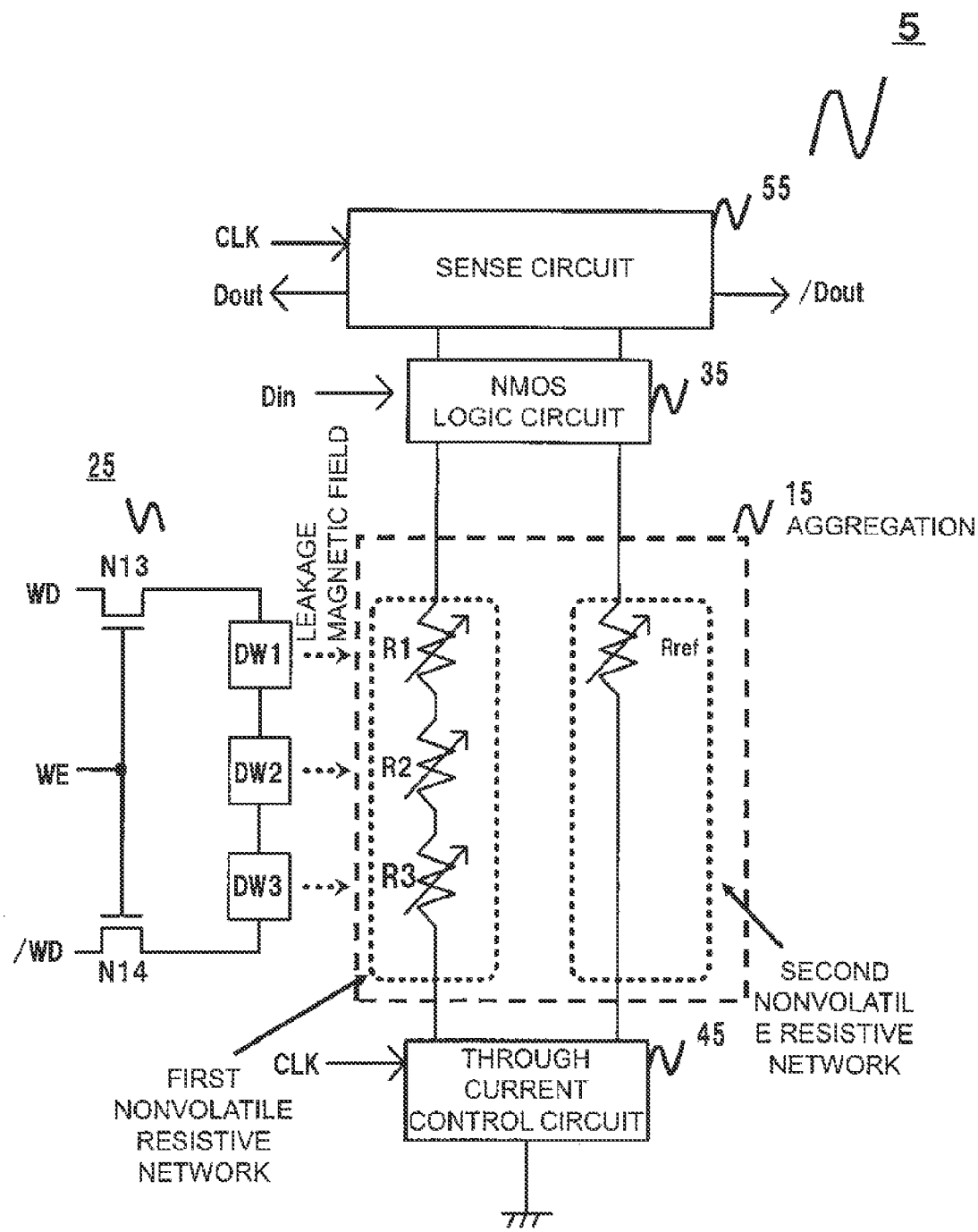
FIG. 12 is a circuit diagram of a resistive network aggregation according to a fifth embodiment of the present invention, and a nonvolatile logic gate using the resistive network aggregation.

FIG. 12 is a circuit diagram of a nonvolatile resistive network aggregation 15 according to a fifth embodiment and a nonvolatile logic gate 5 having an enhanced error tolerance with use of the nonvolatile resistive network aggregation 15. In the nonvolatile logic gate 5 of the present embodiment, a specific writing part 25 for nonvolatile resistive elements uses domain wall motion elements DW1, DW2, and DW3. Furthermore, sense elements (magnetoresistive elements) are used for the nonvolatile resistive elements R1, R2, and R3, which form a first nonvolatile resistive network. The second nonvolatile resistive network is configured to have a resistance value Rref.

More specifically, the nonvolatile logic gate 5 includes NMOS transistors N13 and N14, domain wall motion elements DW1, DW2, and DW3, complementary data input signals WD and /WD, and a writing enable signal WE. Each of the domain wall motion elements affects the resistance of each of the sense elements through a leakage magnetic field.

Connections of the writing part 25 of the present embodiment will be described. The domain wall motion elements DW1, DW2, and DW3 are connected in series. An end of the domain wall motion elements DW1, DW2, and DW3 is connected to the NMOS transistor N13, and the other end of the domain wall motion elements DW1, DW2, and DW3 is connected to the NMOS transistor N14. The NMOS transistor N13 is connected to the writing data terminal WD, and the NMOS transistor N14 is connected to the writing data terminal /WD. Gates of the NMOS transistors N13 and N14 are connected to the writing enable signal WE.

The sense circuit 55 uses the circuit illustrated in FIG. 5(b), and the through current control circuit 45 uses the circuit illustrated in FIG. 2(a). Furthermore, the NMOS logic circuit 35 uses the circuit illustrated in FIG. 2(c).

Figure 13:
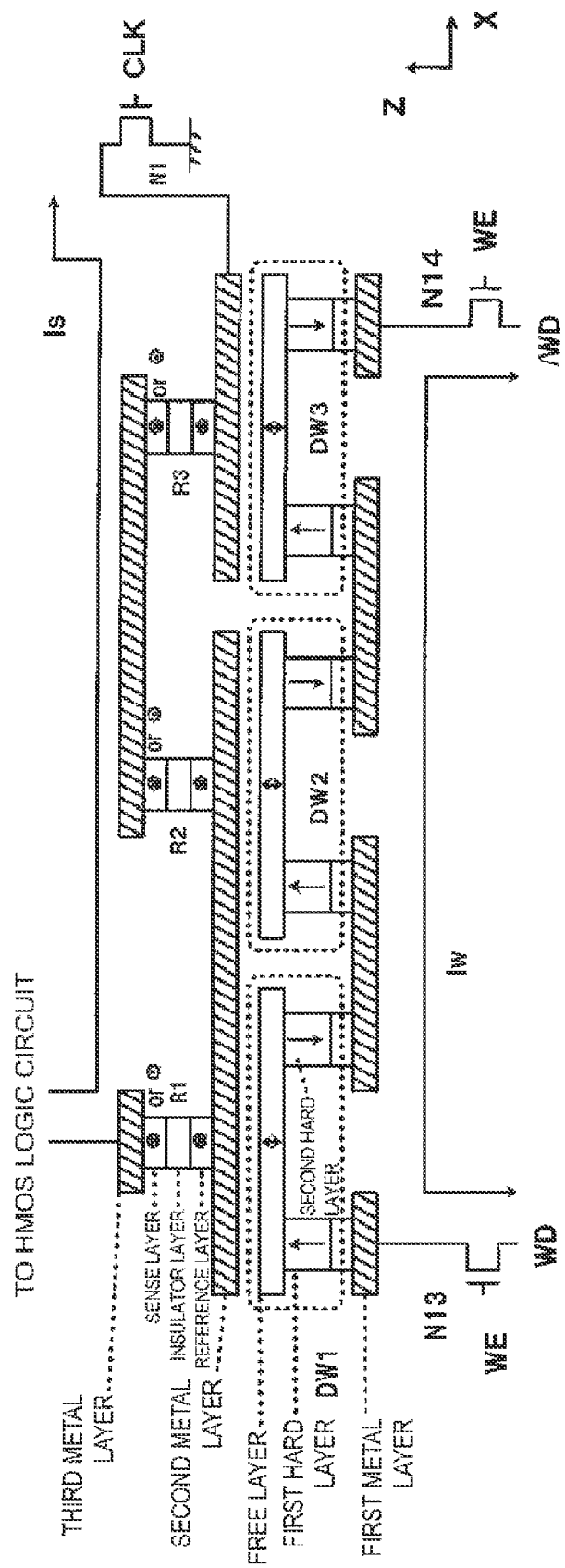
FIG. 13 is a cross-sectional view of the resistive network aggregation according to the fifth embodiment of the present invention, and the nonvolatile logic gate using the resistive network aggregation.

FIG. 13 is a cross-sectional view showing the vicinity of the first nonvolatile resistive network in the present embodiment. FIG. 13 shows the NMOS transistors N13 and N14, the domain wall motion elements DW1, DW2, and DW3, the nonvolatile resistive elements R1, R2, and R3, and the NMOS transistor N1 of the through current control circuit 45. The longitudinal direction of the domain wall motion elements in the plane of each layer is defined as the X-direction, and the direction perpendicular to the plane is defined as the Z-direction.

Figure 14:
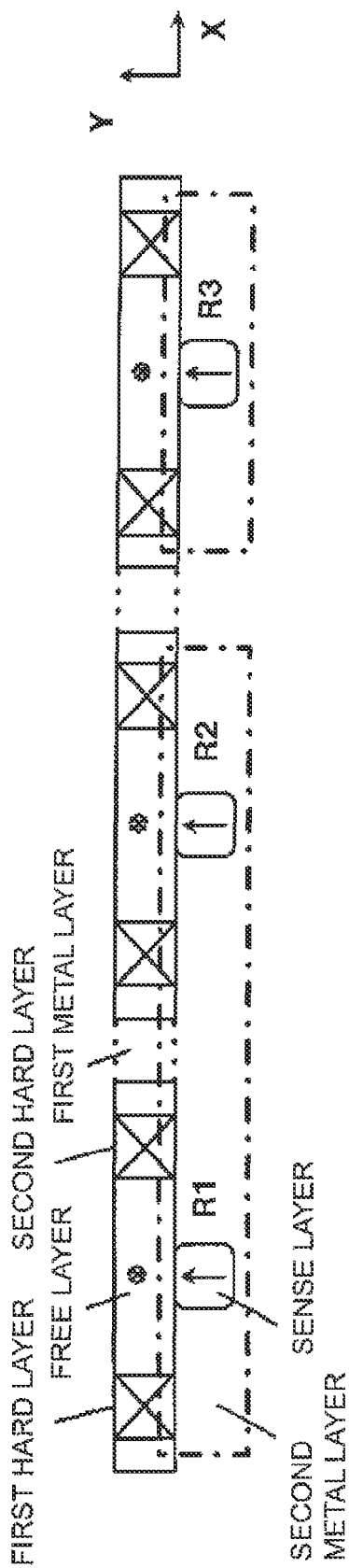
FIG. 14 is a top view of the resistive network aggregation according to the fifth embodiment of the present invention, and the nonvolatile logic gate using the resistive network aggregation.

FIG. 14 is a plan view showing the vicinity of the first nonvolatile resistive network in the present embodiment. The longitudinal direction of the domain wall motion elements DW1, DW2, and DW3 is defined as the X-direction, and the direction perpendicular to the longitudinal direction of the domain wall motion elements DW1, DW2, and DW3 is defined as the Y-direction.

Each of the domain wall motion elements DW1, DW2, and DW3 includes a free layer, a first hard layer, and a second hard layer. As an example, a magnetic thin film having perpendicular magnetic anisotropy is used for the free layer, the first hard layer, and the second hard layer. Each of the sense elements includes a sense layer, an insulator layer, and a reference layer. As an example, a magnetic thin film having in-plane magnetic anisotropy is used for the sense layer and the reference layer. As a specific material for the free layer, the hard layer, the sense layer, and the reference layer, it is preferable to use a material including at least one selected from Fe, Co, and Ni. Furthermore, the film thickness of the free layer, the hard layer, the sense layer, and the reference layer is preferably in a range of 1 nm to 20 nm.

A cross-sectional structure of the nonvolatile logic gate 5 of the present embodiment will be described with reference to FIG. 13. The cross-sectional structure includes, from the side of the substrate, transistor layers forming CMOS circuits, first metal layers, first hard layers or second hard layers, free layers, second metal layers, reference layers, insulator layers, sense layers, and third metal layers. The sense element may include, from a side of the substrate, a sense layer, an insulator layer, and a reference layer in the reverse order to that shown in FIG. 13. Furthermore, the first hard layer and the second hard layer may be stacked above the free layer. The directions of magnetization of the first hard layer and the second hard layer are fixed so as to be opposite to each other as indicated by arrows in FIG. 13. A writing current Iw is supplied to the free layers when the writing enable signal WE is brought into a high level. The magnetization of the free layers can be changed vertically along the Z-direction by the spin torque effect depending upon the direction of the spin polarization current as the writing current Iw. The sense layers of the sense elements are located above the free layers. Thus, the sense layers can sensitively detect a leakage magnetic field from the free layers. Furthermore, the sense elements may be located below the free layers.

In the nonvolatile logic gate of the present embodiment, the writing current Iw flows through the NMOS transistor N13 into the free layers connected in series. The direction of magnetization of the free layers can be oriented to the Z-direction or the −Z-direction depending upon the direction of the writing current. The reading current Is flows from the sense circuit 55 and the NMOS logic circuit 35 through the three sense elements R1, R2, and R3 and the NMOS transistor N1 into the ground. In FIG. 13, the direction of magnetization is represented by a mark indicative of one direction.

Next, the two-dimensional structure of the vicinity of the first nonvolatile resistive network according to the present embodiment will be described with reference to FIG. 14. The domain wall motion elements DW1, DW2, and DW3 are electrically connected in series. The magnetization of the sense layers of the sense elements R1, R2, and R3, which are slightly deviated from the central axes of the free layers in the Y-direction, is oriented to the +Y-direction or the −Y-direction by the leakage magnetic field from the free layers. When the directions of the reference layers of the sense elements are set in the +Y-direction and the magnetization of the free layers of the domain wall motion elements is oriented to the −Z-direction, the sense elements R1, R2, and R3 are brought into a low-resistance state RL. When the writing current is reversed, the magnetization of the free layers is reversed. The resistive state of each of the sense elements is reversed so that the sense elements are brought into a high-resistance state RH.

In the nonvolatile logic gate 5 of the present embodiment, the nonvolatile resistive network is formed by three nonvolatile resistive elements in order to increase an error tolerance. A writing current is supplied in series through those nonvolatile resistive elements. The nonvolatile resistive elements are subjected to a writing process concurrently by the same current. Therefore, no writing circuit is added, so that a circuit area to be added can be reduced. At the same time, the electric power consumption can also be reduced. Furthermore, the nonvolatile resistive elements are stacked on the CMOS circuits. Therefore, an increase of the circuit area can be prevented.

As described above, the nonvolatile resistive network aggregation 15 according to the present embodiment and the nonvolatile logic gate 5 using the nonvolatile resistive network aggregation 15 can enhance an error tolerance while an addition of the circuit area and an increase of the electric power consumption are prevented.

Sixth Embodiment

Figure 15:
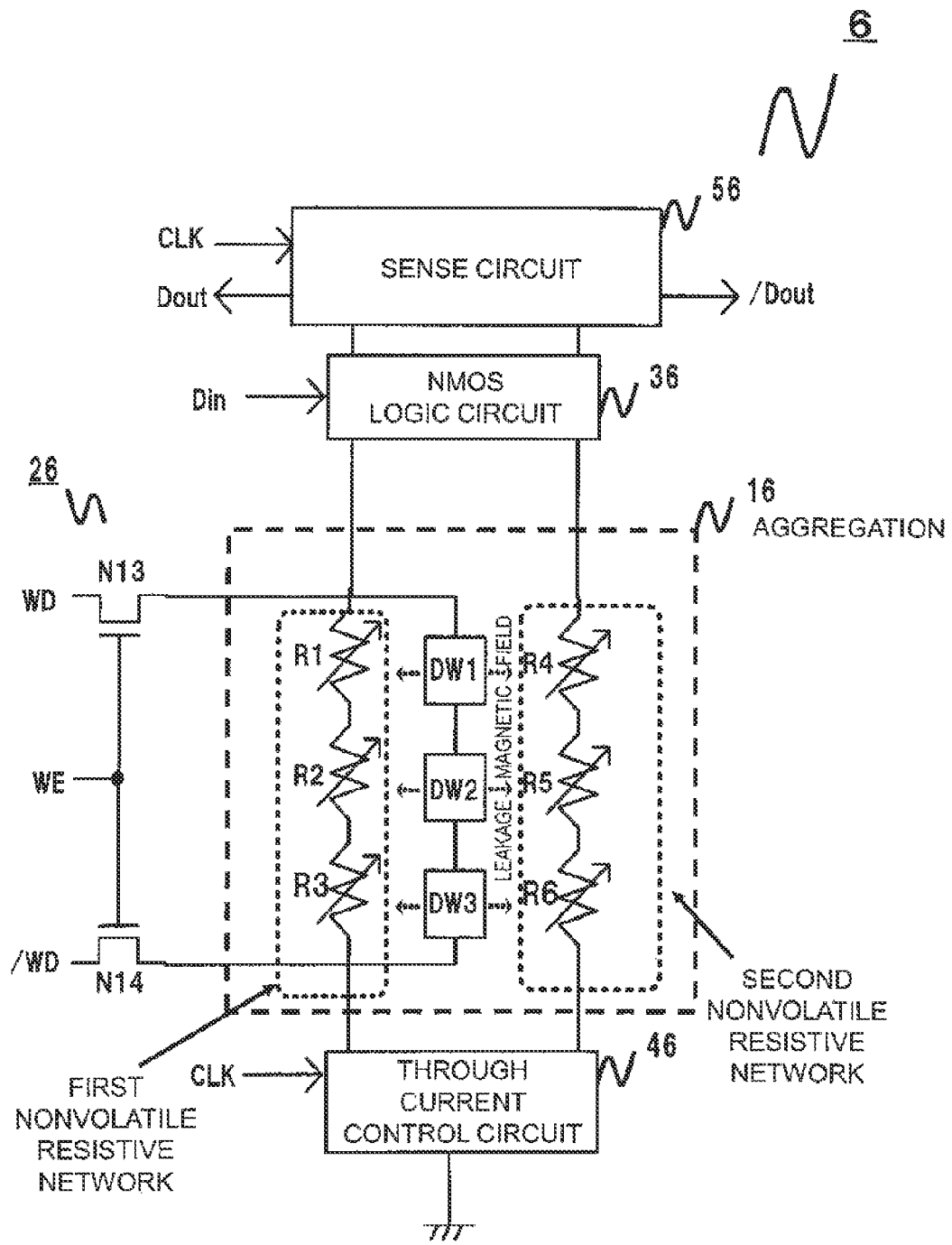
FIG. 15 is a circuit diagram of a resistive network aggregation according to a sixth embodiment of the present invention, and a nonvolatile logic gate using the resistive network aggregation.

FIG. 15 is a circuit diagram of a nonvolatile resistive network aggregation 16 according to a sixth embodiment and a nonvolatile logic gate 6 having an enhanced error tolerance with use of the nonvolatile resistive network aggregation 16. The nonvolatile logic gate 6 of the present embodiment differs from those of the first to fifth embodiments in that the resistance value of the second nonvolatile resistive network is not fixed and that complementary data to the stored data of the first nonvolatile resistive network are stored. In the present embodiment, a writing part 26 for nonvolatile resistive elements uses domain wall motion elements. Furthermore, sense elements are used for the nonvolatile resistive elements R1, R2, R3, R4, R5, and R6.

More specifically, the nonvolatile logic gate 6 includes NMOS transistors N13 and N14, complementary data input signals WD and /WD, and a writing enable signal WE. Each of the domain wall motion elements DW1, DW2, and DW3 affects the resistance of each of the sense elements through a leakage magnetic field.

Connections of the writing part 26 of the present embodiment are the same as those in the fifth embodiment, and further explanation thereof is omitted herein.

The sense circuit 56 uses the circuit illustrated in FIG. 5(b), and the through current control circuit 46 uses the circuit illustrated in FIG. 2(a). Furthermore, the NMOS logic circuit 36 uses the circuit illustrated in FIG. 2(c).

The cross-sectional structure of the vicinity of the nonvolatile resistive elements in the nonvolatile logic gate of the present embodiment is the same as that in the fifth embodiment, and further explanation thereof is omitted herein.

Figure 16:
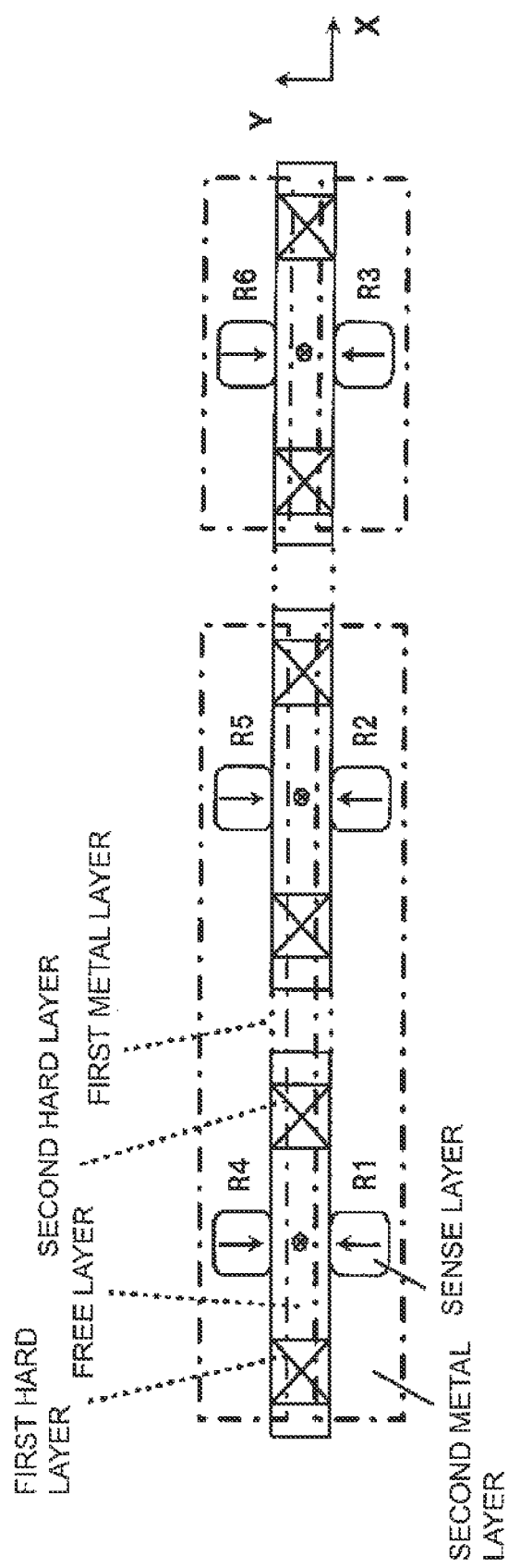
FIG. 16 is a top view of the resistive network aggregation according to the sixth embodiment of the present invention, and the nonvolatile logic gate using the resistive network aggregation.

FIG. 16 is a plan view showing the vicinity of the nonvolatile resistive network aggregation 16 in the present embodiment. The longitudinal direction of the domain wall motion elements is defined as the X-direction, and the direction perpendicular to the longitudinal direction of the domain wall motion elements is defined as the Y-direction.

Each of the domain wall motion elements DW1, DW2, and DW3 includes a free layer, a first hard layer, and a second hard layer. As an example, a magnetic thin film having perpendicular magnetic anisotropy is used for the free layer, the first hard layer, and the second hard layer. Each of the sense elements includes a sense layer, an insulator layer, and a reference layer. As an example, a magnetic thin film having in-plane magnetic anisotropy is used for the sense layer and the reference layer.

The domain wall motion elements DW1, DW2, and DW3 are electrically connected in series. The magnetization of the sense layers of the sense elements R1, R2, and R3, which are slightly deviated from the central axes of the free layers in the −Y-direction, is oriented to the −Y-direction or the +Y-direction by the leakage magnetic field from the free layers. When the direction of the reference layer of each of the sense elements is set in the +Y-direction and the magnetization of the free layer of each of the domain wall motion elements is oriented in the −Z-direction, then the sense elements R1, R2, and R3 are brought into a low-resistance state RL3. On the other hand, the sense elements R4, R5, and R6 are brought into a high-resistance state RH. If a writing current is reversed, the direction of the magnetization of the free layers is reversed. Thus, the resistance state of each of the sense elements is inversed.

In the nonvolatile logic gate 6 of the present embodiment, each of the first and second nonvolatile resistive networks is formed by three nonvolatile resistive elements in order to enhance an error tolerance. The first nonvolatile network and the second nonvolatile resistive network store and hold complementary data. A writing current is supplied in series through those domain wall motion elements. The domain wall motion elements are subjected to a writing process concurrently by the same current. Therefore, no writing circuit is added, so that a circuit area to be added can be reduced. At the same time, the electric power consumption can also be reduced. Furthermore, the domain wall motion elements are stacked on the CMOS circuits. Therefore, an increase of the circuit area can be prevented.

As described above, the nonvolatile resistive network aggregation 16 according to the present embodiment and the nonvolatile logic gate 6 using the nonvolatile resistive network aggregation 16 can enhance an error tolerance while an addition of the circuit area and an increase of the electric power consumption are prevented.

Seventh Embodiment

Figure 17:
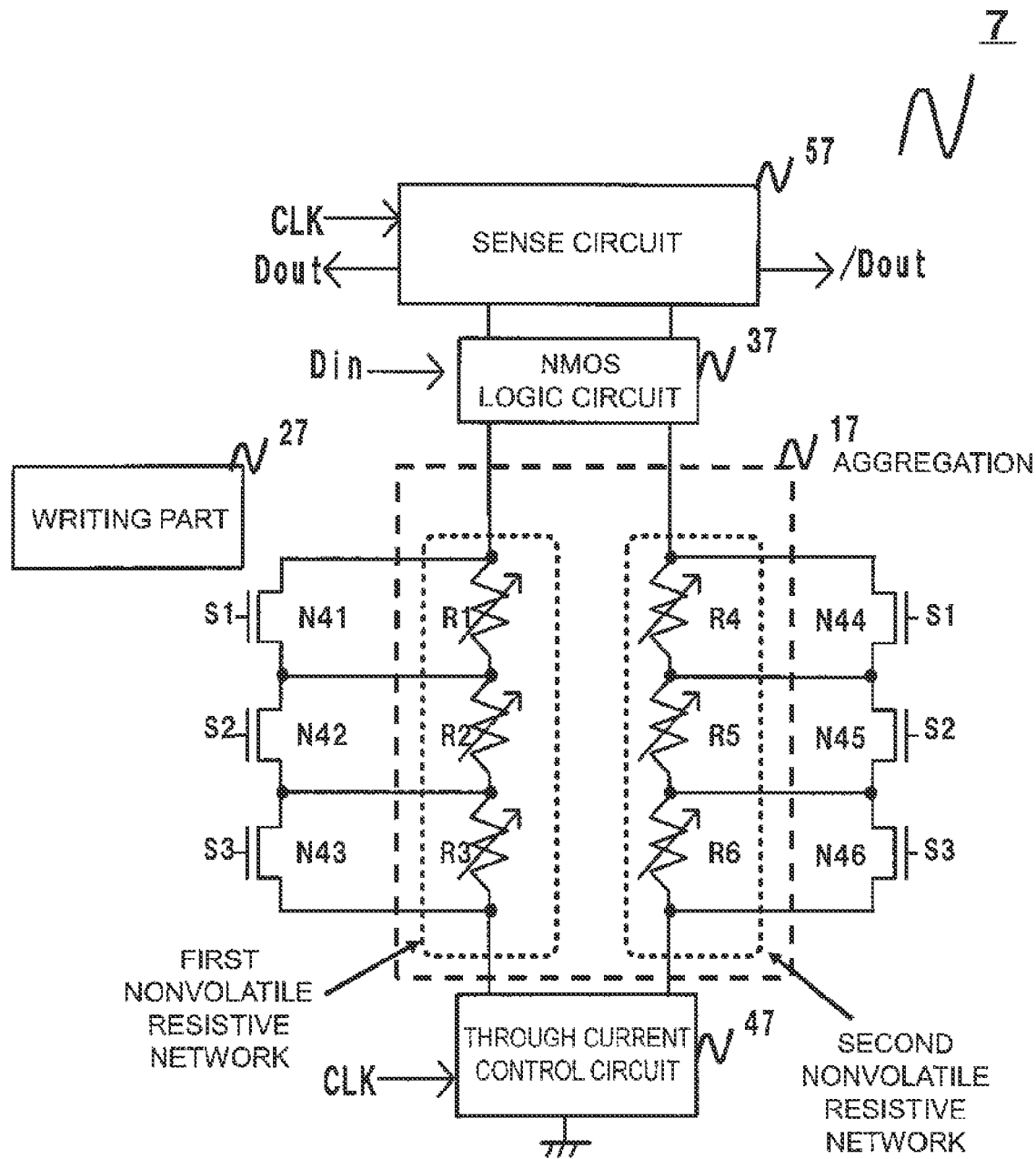
FIG. 17 is a circuit diagram of a resistive network aggregation according to a seventh embodiment of the present invention, and a nonvolatile logic gate using the resistive network aggregation.

FIG. 17 is a circuit diagram of a nonvolatile resistive network aggregation 17 according to a seventh embodiment and a nonvolatile logic gate 7 having an enhanced error tolerance with use of the nonvolatile resistive network aggregation 17. The nonvolatile logic gate 7 of the present embodiment can perform a test operation on the nonvolatile resistive elements and can also correctly operate with use of redundant nonvolatile resistive elements even in a case of any physical defect such as a short circuit or an open circuit in addition to a soft error.

The nonvolatile logic gate 7 of the present embodiment will be described with reference to FIG. 17. In the nonvolatile logic gate 7 of the present embodiment, NMOS transistors N41, N42, N43, N44, N45, and N46 are added to the configuration of the sixth embodiment.

The nonvolatile resistive element R1 and the NMOS transistor N41 are connected in parallel. Similarly, the nonvolatile resistive element R2 and the NMOS transistor N42 are connected in parallel. The nonvolatile resistive element R3 and the NMOS transistor N43 are connected in parallel. The nonvolatile resistive element R4 and the NMOS transistor N44 are connected in parallel. The nonvolatile resistive element R5 and the NMOS transistor N45 are connected in parallel. The nonvolatile resistive element R6 and the NMOS transistor N46 are connected in parallel.

Furthermore, the nonvolatile resistive elements R1, R2, and R3 are connected in series. An end of the nonvolatile resistive elements R1, R2, and R3 is connected to the NMOS logic circuit 37, and the other end of the nonvolatile resistive elements R1, R2, and R3 is connected to the through current control circuit 47. The nonvolatile resistive elements R4, R5, and R6 are connected in series. An end of the nonvolatile resistive elements R4, R5, and R6 is connected to the NMOS resistive elements R1, R2, and R3 is connected to the NMOS logic circuit 37, and the other end of the nonvolatile resistive elements R1, R2, and R3 is connected to the through current control circuit 47.

For example, as with the sixth embodiment, the writing part 27 can use domain wall motion elements. The sense circuit 57 uses the circuit illustrated in FIG. 5(b), and the through current control circuit 47 uses the circuit illustrated in FIG. 2(a). Furthermore, the NMOS logic circuit 37 uses the circuit illustrated in FIG. 2(c).

Next, a test method of the nonvolatile resistive elements in the nonvolatile logic gate 7 of the present embodiment will be described.

This test operation is performed to screen initial defects before a product in which the nonvolatile logic gate has been incorporated is shipped. The nonvolatile logic gate 7 has characteristics that its impedance becomes lower than that of the nonvolatile resistive element Rn (n is 1 to 6 in FIG. 17) when the transistor N4n (n is 1 to 6 in FIG. 17) is turned on. As a result, a reading current flows primarily through the transistor N4n while the transistor N4n is turned on. Those characteristics are used to perform a test operation.

In other words, each of the nonvolatile resistive elements has a structure in which an element capable of providing an impedance lower than the nonvolatile resistive element is connected in parallel to that nonvolatile resistive element. When the impedance of each of the elements is lowered, paths through which a reading current flows can be controlled. Such characteristics are used to perform a test operation.

First, a test operation is performed in a state in which data "0" are stored in the nonvolatile logic gate. Specifically, the writing part 27 is controlled such that the nonvolatile resistive elements R1, R2, and R3 have a resistance value RL in a low-resistance state and that the nonvolatile resistive element R4, R5, and R6 have a resistance value RH in a high-resistance state.

When the nonvolatile resistive elements R1 and R4 are tested, a signal S1 at a low level and signals S2 and S3 at a high level are provided as a signal for a test operation to Din. Thus, a logical operation (circuit test operation) is performed. In this state, the transistors N41 and N44 are turned off, and the transistors N42, N43, N45, and N46 are turned on. At that time, a reading current through the first nonvolatile network flows primarily from the sense circuit 57 through the NMOS logic circuit 37, the nonvolatile resistive element R1, the transistors N42 and N43, and the through current control circuit 47 to the ground. Furthermore, a reading current through the second nonvolatile network flows primarily from the sense circuit 57 through the NMOS logic circuit 37, the nonvolatile resistive element R4, and the transistors N45 and N46, and the through current control circuit 47 to the ground. Therefore, according to a resistance difference between the nonvolatile resistive elements R1 and R4, a difference is produced between the currents flowing through the first and second nonvolatile networks. Thus, a circuit operation (logical operation) is performed based upon the current difference. If the test outputs a result that is different from a certain expected circuit operation, then an error may have occurred because of the resistance value of the nonvolatile resistive element R1 or R4.

Similarly, when the nonvolatile resistive elements R2 and R5, a signal S2 at a low level and signals S1 and S3 at a high level are provided as a signal for a test operation to Din. Thus, a logical operation (circuit test operation) is performed. In this state, the transistors N42 and N45 are turned off, and the transistors N41, N43, N44, and N46 are turned on. At that time, a reading current through the first nonvolatile network flows primarily from the sense circuit 57 through the NMOS logic circuit 37, the transistor N41, the nonvolatile resistive element R2, the transistor N43, and the through current control circuit 47 to the ground. Furthermore, a reading current through the second nonvolatile network flows primarily from the sense circuit 57 through the NMOS logic circuit 37, the transistor N44, the nonvolatile resistive element R5, the transistor N46, and the through current control circuit 47 to the ground. Therefore, according to a resistance difference between the nonvolatile resistive elements R2 and R5, a difference is produced between the currents flowing through the first and second nonvolatile networks. Thus, a circuit operation (logical operation) is performed based upon the current difference. If the test outputs a result that is different from a certain expected circuit operation, then an error may have occurred because of the resistance value of the nonvolatile resistive element R2 or R5.

Similarly, when the nonvolatile resistive elements R3 and R6, a signal S3 at a low level and signals S1 and S2 at a high level are provided as a signal for a test operation to Din. Thus, a logical operation (circuit test operation) is performed. In this state, the transistors N43 and N46 are turned off, and the transistors N41, N42, N44, and N45 are turned on. At that time, a reading current through the first nonvolatile network flows primarily from the sense circuit 57 through the NMOS logic circuit 37, the transistor N41, N42, the nonvolatile resistive element R3, and the through current control circuit 47 to the ground. Furthermore, a reading current through the second nonvolatile network flows primarily from the sense circuit 57 through the NMOS logic circuit 37, the transistor N44 and N45, the nonvolatile resistive element R6, and the through current control circuit 47 to the ground. Therefore, according to a resistance difference between the nonvolatile resistive elements R3 and R6, a difference is produced between the currents flowing through the first and second nonvolatile networks. Thus, a circuit operation (logical operation) is performed based upon the current difference. If the test outputs a result that is different from a certain expected circuit operation, then an error may have occurred because of the resistance value of the nonvolatile resistive element R3 or R6. Those test results are compared with an expected certain circuit operation by a human or a machine for thereby determining the quality of products.

Next, a test operation is performed in a state in which data "1" are stored in the nonvolatile logic gate. Specifically, the writing part 27 is controlled such that the nonvolatile resistive elements R1, R2, and R3 have a resistance value RH in a high-resistance state and that the nonvolatile resistive element R4, R5, and R6 have a resistance value RL in a low-resistance state. The test operation is performed by the same test method as in the test where data "0" are stored.

If it is estimated from the test results that any of the nonvolatile resistive elements has a defective resistance value, then the corresponding transistor is set with a fuse or the like so that it is turned on. Specifically, if it is estimated that R1 or R4 is defective, the signal S1 is set at a high level to turn the transistors N41 and N44 on. If it is estimated that R2 or R5 is defective, the signal S2 is set at a high level to turn the transistors N42 and N45 on. If it is estimated that R3 or R6 is defective, the signal S3 is set at a high level to turn the transistors N43 and N46 on.

Thus, the nonvolatile logic gate 7 can correctly operate by using the redundant nonvolatile resistive elements if at least one pair of nonvolatile resistive elements is estimated to correctly operate. If no pair of nonvolatile resistive elements is estimated to be defective, the nonvolatile logic gate 7 can correctly operate by using the redundant nonvolatile resistive elements even with a soft error. Specifically, the redundant nonvolatile resistive elements according to the present embodiment can be used not only for recovering a hard error, but also for recovering a soft error. According to another aspect, separate circuits are required for recovery of a hard error and recovery of a soft error. Therefore, an increase of the circuit area and an increase of the electric power consumption can be prevented.

Figure 18:
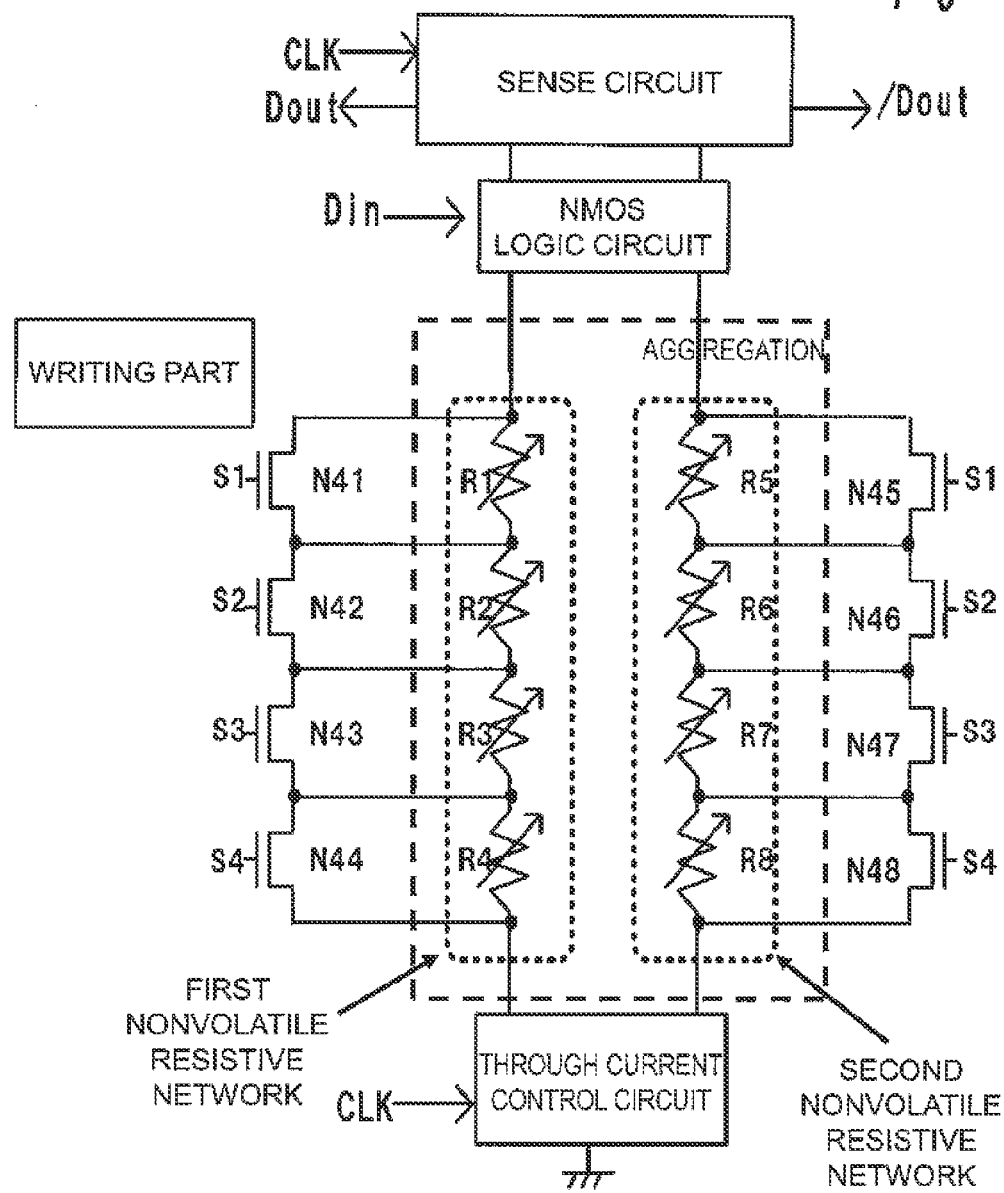
FIG. 18 is a circuit diagram of a resistive network aggregation according to a variation of the seventh embodiment of the present invention, and a nonvolatile logic gate using the resistive network aggregation.

The number of the nonvolatile resistive elements in each of the nonvolatile resistive networks of the present embodiment may be equal to or greater than three. For example, a nonvolatile logic gate 7-2 illustrated in FIG. 18, which is a variation of the nonvolatile logic gate 7 of the present embodiment, has four nonvolatile resistive elements in each of the nonvolatile resistive networks. In this variation, even if a pair of nonvolatile resistive elements suffers from a hard defect, a soft error can be recovered by using the remaining three pairs of nonvolatile resistive elements.

In other words, when the nonvolatile logic gate has a certain number of memory structures, each of which is formed by resistive networks having at least four nonvolatile resistive elements being connected, it can have a structure that can recover a soft error as well as a hard error.

Figure 19:
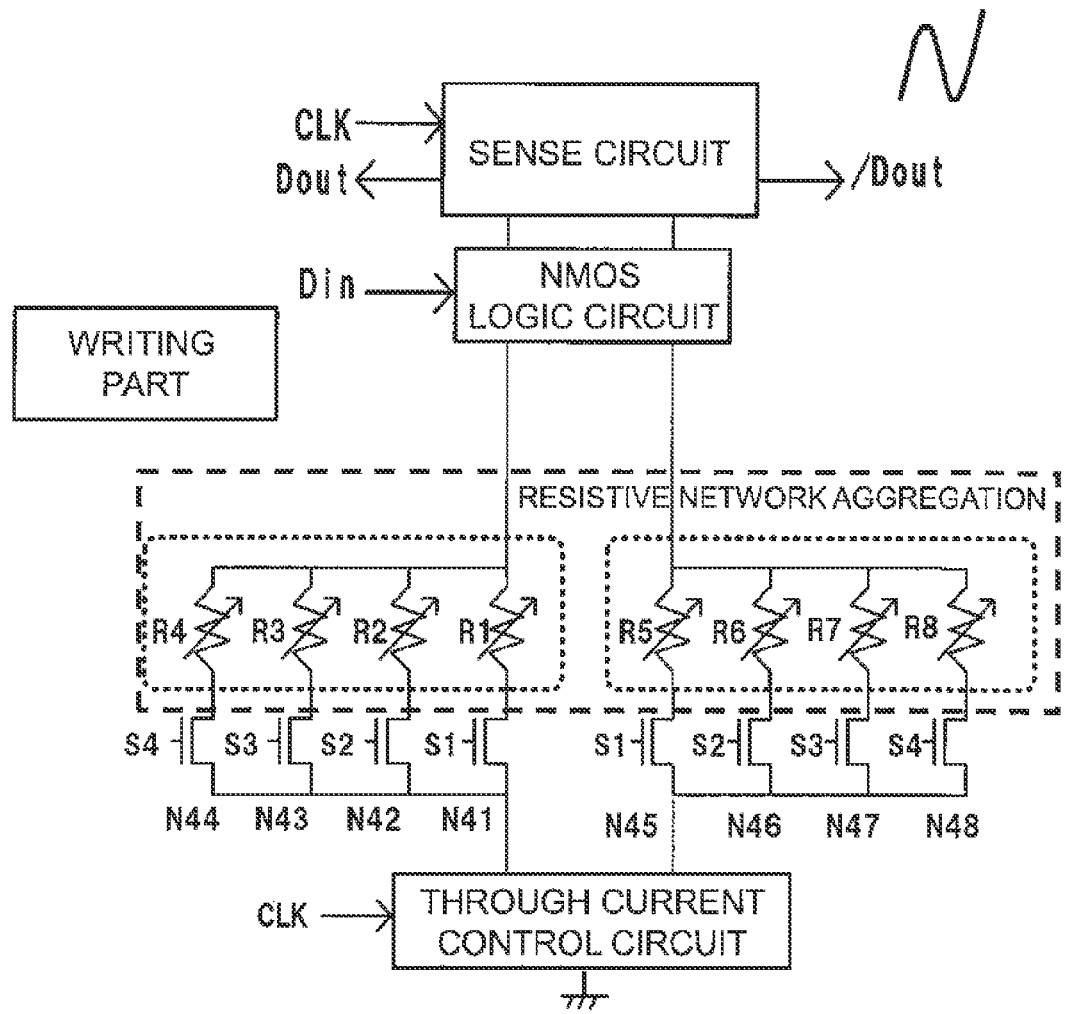
FIG. 19 is a circuit diagram of a resistive network aggregation according to a variation of the seventh embodiment of the present invention, and a nonvolatile logic gate using the resistive network aggregation.

Furthermore, the nonvolatile resistive elements in each of the nonvolatile resistive networks of the present embodiment may be connected in parallel. For example, a nonvolatile logic gate 7-3 illustrated in FIG. 19 includes four nonvolatile resistive elements in each of the nonvolatile resistive networks. Those nonvolatile resistive elements are connected in parallel. In this variation, defective nonvolatile resistive elements can be excluded from use by bringing a signal Sn (n is an integer from 1 to 4) corresponding to the defective nonvolatile resistive elements into a low level. Therefore, the nonvolatile logic gate 7-3 can have a structure that can recover a soft error as well as a hard error.

Furthermore, a series connection and a parallel connection may be combined with each other, like two series connections and two parallel connections.

Moreover, since a corresponding nonvolatile resistive element is excluded from use in a reference resistive network in order to recover a hard error, the number of hard errors to be recovered corresponds to the number of the reference resistive networks. Therefore, the nonvolatile logic gate may have a plurality of reference resistance values Rref so as to correspond to an increase of memory structures according to circuit integration. An increase of the number of the reference resistive networks can cope with hard defects at different positions of the nonvolatile resistive elements. This structure may be configured such that nonvolatile logic gates that are structurally located at close positions (for example, adjacent nonvolatile logic gates) share with this structure. Furthermore, the nonvolatile logic gate may be configured such that a logical configuration or a circuit configuration is redesigned properly after the test, and a circuit configuration that can have a plurality of reference resistive networks for each of the resistive networks may be provided.

As described above, the nonvolatile resistive network aggregation 17 according to the present embodiment and the nonvolatile logic gate 7 using the nonvolatile resistive network aggregation 17 can enhance the error tolerance for both of soft errors and soft errors while an addition of the circuit area and an increase of the electric power consumption are prevented.

Although the present invention has specifically been described based upon some embodiments, the present invention is not limited to the aforementioned embodiments. As a matter of course, various changes, such as separation or combination of the contents of the embodiments, may be made without departing from the spirit of the invention. Those changes should also be included in the present invention.

As described above, according to the present invention, there can be provided a nonvolatile logic gate having an enhanced error tolerance that can correctly perform a logical operation even if an error occurs in memory data while an addition of the circuit area and an increase of the electric power consumption are prevented, and a nonvolatile integrated circuit.

This application claims the benefit of priority from Japanese patent application No. 2012-132412, filed on Jun. 11, 2012, the disclosure of which is incorporated herein in its entirety by reference.

DESCRIPTION OF REFERENCE NUMERALS 1-7 nonvolatile logic gate
11-17 nonvolatile resistive network aggregation (memory structure group)
21-27 writing part (writing circuit, writing means)
31-37 NMOS logic circuit (desired logic)
41-47 through current control circuit
51-57 sense circuit

The invention claimed is:

1. A nonvolatile logic gate device characterized by comprising:
a resistive network of a memory structure comprising at least three nonvolatile resistive elements which are combined with each other and which exhibit a first combined resistance value in a low-resistance state and a second combined resistance value in a high-resistance state;
a reference resistive network comprising a same number of nonvolatile resistive elements as the resistive network of the memory structure and a reference resistance value between the first combined resistance value and the second combined resistance value;
a writing part configured to selectively put the resistive network into the low-resistance state or the high-resistance state by selectively writing the first combined resistance value and the second combined resistance value into the resistive network; and
a logic circuit structure configured to determine a resistance value of the resistive network to selectively sat the resistive network into the low-resistance state or the high-resistance state by comparing each of the first combined resistance value and the second combined resistance value with the reference resistance value.

2. The nonvolatile logic gate device as recited in claim 1, wherein:
the resistive network comprises an odd number of nonvolatile resistive elements.

3. The nonvolatile logic gate device as recited in claim 1, wherein:
the reference resistance value is determined as a value that is matched with the first combined resistance value and the second combined resistance value which are caused to occur in a soft error obtained from the nonvolatile resistive elements connected in the resistive network.

4. The nonvolatile logic gate device as recited in claim 1, wherein:

the reference resistive network comprises a structure which corresponds to the resistive network formed by connecting the nonvolatile resistive elements, and
the reference resistive network comprises the structure adjustable based upon the first combined resistance value and the second combined resistance value which are caused to occur in a hard error of the nonvolatile resistive elements in the resistive network.

5. The nonvolatile logic gate device as recited in claim 1, wherein:
the resistive network and the reference resistive network are connected in the form of either one of a series connection, a parallel connection, and a series and parallel connection.

6. The nonvolatile logic gate device as recited in claim 1, wherein:
the reference resistive network comprises nonvolatile resistive elements as the at least three resistive elements and each of the nonvolatile resistive elements in the resistive network and the reference resistive network comprises a magnetoresistive element.

7. The nonvolatile logic gate device as recited in claim 1, wherein:
the reference resistive network comprises nonvolatile resistive elements as the at least three resistive elements and each of the nonvolatile resistive elements in the resistive network and the reference resistive network comprises a magnetoresistive element, and
the writing part comprises a circuit configuration which is formed by magnetic domain wall motion elements connected in series and configured to control each of the nonvolatile resistive elements.

8. The nonvolatile logic gate device as recited in claim 1, wherein:
the reference resistive network comprises nonvolatile resistive elements as the at least three resistive elements, and
the writing part comprises a series circuit configuration configured to collectively and respectively rewrite a resistance of each of the nonvolatile resistive elements, which form the resistive network and the reference resistive network, and are included in one network.

9. A nonvolatile logic gate device comprising:
one or more resistive networks having a memory structure, in which at least three nonvolatile resistive elements are connected to each other, exhibiting a first combined resistance value in a low-resistance state and a second combined resistance value in a high-resistance state;
a reference resistive network comprising at least three resistive nonvolatile resistive elements equal in number to the at least three nonvolatile elements of the one or more resistive networks and a reference resistance value between the first combined resistance value and the second combined resistance value;
a writing part configured to selectively put each of the one or more resistive networks into the first combined resistance value and the second combined resistance value; and
a logical operation circuit configured to use the memory structure,
wherein the writing part is further configured to collectively rewrite the first combined resistance value and the second combined resistance value into the at least three nonvolatile resistive elements,
each of the one or more resistive networks is configured to provide a nonvolatile input to a logical operation in the logical operation circuit when a resistance value of each of the resistive networks is compared with a resistance value of the reference resistive network, and the nonvolatile input to the resistive network corresponds to data stored in the nonvolatile resistive elements and is collectively and selectively rewritten by the writing part into a combined resistance value of the at least three nonvolatile resistive elements.

10. The nonvolatile logic gate device as recited in claim 1, comprising:
a structure configured to hold a value of the reference resistive network between Rref=N·RL and N·RH that meets the following Formula 1 in a case where the resistive network includes N nonvolatile resistive elements connected in series:

$$RH-RL=dR \quad \text{(Formula 1)}$$

where RL is a resistance value of the nonvolatile resistive element in a low-resistance state, RH is a resistance value of the nonvolatile resistive element in a high-resistance state, and dR is a difference between RL and RH.

11. The nonvolatile logic gate device as recited in claim 1, comprising:
a structure configured to hold a value of the reference resistive network at Rref that meets the following Formulas 1 and 2 in a case where the resistive network includes N nonvolatile resistive elements connected in series:

$$RH-RL=dR \quad \text{(Formula 1)}$$

$$Rref=N·RL+(N·dR/2) \quad \text{(Formula 2)}$$

where RL is a resistance value of the nonvolatile resistive element in a low-resistance state, RH is a resistance value of the nonvolatile resistive element in a high-resistance state, and dR is a difference between RL and RH.

12. The nonvolatile logic gate device as recited in claim 1, comprising:
a structure in which a value of the reference resistive network, or a resistance value Rref, and a threshold Vth for determining a logical value obtained from the memory structure in the logic circuit structure meet the following Formula 3 when N is odd and meet the following Formula 4 when N is even in a case where the resistive network includes N nonvolatile resistive elements connected in series:

$$((RL+RH)·N/2-dR/2)/(((RL+RH)·N/2-dR/2)+Rref) < Vth/Vdd < ((RL+RH)·N/2+dR/2)/(((RL+RH)·N/2+dR/2)+Rref) \quad \text{(Formula 3)}$$

$$((RL+RH)·N/2-dR)/(((RL+RH)·N/2-dR)+Rref) < Vth/Vdd < ((RL+RH)·N/2+dR)/(((RL+RH)·N/2+dR)+Rref) \quad \text{(Formula 4)}$$

where Vdd is a power source voltage value of the logic circuit structure, RL is a resistance value of the nonvolatile resistive element in a low-resistance state, and RH is a resistance value of the nonvolatile resistive element in a high-resistance state, and dR is a difference between RL and RH.

13. A nonvolatile logic gate device comprising:
a resistive network of a memory structure comprising at least three nonvolatile resistive elements which are combined with each other and which exhibit a first combined resistance value in a low-resistance state and a second combined resistance value in a high-resistance state;
a reference resistive network comprising a same number of nonvolatile resistive elements as the resistive network of the memory structure and a reference resistance value;
a writing part configured to selectively put the resistive network into the low-resistance state or the high-resistance state by selectively writing the first and the second combined resistance values into the resistive network; and
a logic circuit structure configured to determine a resistance value of the resistive network to selectively put the resistive network into the low-resistance state or the high-resistance state by comparing each of the first combined resistance value and the second combined resistance value with the reference resistance value;
wherein:
the nonvolatile logic gate device further comprises a complementary structure configured to selectively put the reference resistive network into a low-resistance state or a high-resistance state when the resistive network of the memory structure is put into the high-resistance state or the low-resistance state, respectively.

14. The nonvolatile logic gate device as recited in claim 13, wherein:
the writing part further comprises a circuit structure configured to collectively rewrite a pair of nonvolatile resistive elements in the resistive network and the reference resistive network into which complementary data are written.

15. The nonvolatile logic gate device as recited in claim 13, wherein:
each of the nonvolatile resistive elements in the resistive network and the reference resistive network, the at least three resistive elements of the reference resistive network being nonvolatile resistive elements, comprises a magnetoresistive element, and
the writing part further comprises a circuit structure configured to collectively rewrite a pair of nonvolatile resistive elements in the resistive network and the reference resistive network into which complementary data are written, with a leakage magnetic field of a common domain wall motion element.

16. The nonvolatile logic gate device as recited in claim 1, wherein:
nonvolatile resistive elements of the resistive network and the reference resistive network are connected in the form of either one of a series connection and a parallel connection, and the nonvolatile logic gate device comprises a transistor connected in parallel or in series to each of the nonvolatile resistive elements, the at least three resistive elements of the reference resistive network being nonvolatile resistive elements, the nonvolatile logic gate device comprises a structure such that, when a test operation is performed for a hardware error of the circuit, transistors connected in parallel or in series to nonvolatile resistive elements that are not subject to the test operation are put into a conduction state while transistors connected in parallel or in series to nonvolatile resistive elements that are subject to the test operation are put into a non-conduction state, so as to ascertain a predetermined circuit operation as an electric circuit, and then, the transistors connected in parallel or in series to nonvolatile resistive elements judged as being no-good are put into a conduction state and held in the conduction state according to a result of the test operation.

17. The nonvolatile logic gate as recited in claim 16, wherein the resistive network and the reference resistive network includes four or more nonvolatile resistive elements, and the nonvolatile logic gate comprises corresponding transistors connected in parallel or in series, and the nonvolatile logic gate comprises a structure such that the transistors connected in parallel or in series to the nonvolatile resistive elements determined as being no-good are put into the conduction states and transistors connected in parallel or in series that are other than the nonvolatile resistive elements determined as being no-good are put into the non-conduction states, thereby holding the resistance to a soft error in the nonvolatile resistive elements.

18. The nonvolatile logic gate device as recited in claim 1, comprising:

a structure having a plurality of reference resistive networks.

19. An integrated circuit comprising a logical operation circuit including the nonvolatile logic gate device as recited in claim 1.

20. A method of enhancing an error tolerance of a nonvolatile logic gate device, comprising:

providing a resistive network of a memory structure comprising at least three nonvolatile resistive elements which are combined with each other and which exhibit a first combined resistance value in a low-resistance state and a second combined resistance value in a high-resistance state, a reference resistive network comprising a same number of nonvolatile resistive elements as the resistive network of the memory structure and a reference resistance value, a writing part configured to selectively put the resistive network into the low-resistance state or the high-resistance state by selectively writing the first combined resistance value and the second combined resistance value into the resistive network, and a logic circuit structure configured to determine a resistance value of the resistive network to selectively put the resistive network into the low-resistance state or the high-resistance state by comparing each of the first combined resistance value and the second combined resistance value with the reference resistance value;

changing the reference resistance value of the reference resistive network so as to make the reference resistance value correspond to each of the first combined resistance value and the second combined resistance value of the resistive network; and selectively putting resistive network into the low-resistance state or the high-resistance state.

* * * * *

UNITED STATES PATENT AND TRADEMARK OFFICE
CERTIFICATE OF CORRECTION

PATENT NO.            : 9,536,584 B2                                  Page 1 of 1
APPLICATION NO.       : 14/400950
DATED                 : January 3, 2017
INVENTOR(S)           : Nebashi et al.

It is certified that error appears in the above-identified patent and that said Letters Patent is hereby corrected as shown below:

On the Title Page

In the illustrative figure, Line 5:
"Dou:" should be --Dout--;

In the Drawings

Drawing sheet 1 (FIG 1):
"Dou:" should be --Dout--;

In the Specification

Column 13, Line 12:
"33" should be --23--;

In the Claims

Column 23, Line 50 (Claim 1):
"sat" should be --put--;

Column 26, Line 57 (Claim 16):
After "elements," insert --¶--.

Signed and Sealed this
Tenth Day of April, 2018

Andrei Iancu
*Director of the United States Patent and Trademark Office*